United States Patent
Ishihara et al.

(10) Patent No.: US 9,258,897 B2
(45) Date of Patent: Feb. 9, 2016

(54) WIRING BOARD AND METHOD FOR MANUFACTURING THE SAME

(75) Inventors: Teruyuki Ishihara, Ogaki (JP); Hidetoshi Noguchi, Ogaki (JP); Hirofumi Futamura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 374 days.

(21) Appl. No.: 13/484,381

(22) Filed: May 31, 2012

(65) Prior Publication Data

US 2013/0020120 A1 Jan. 24, 2013

Related U.S. Application Data

(60) Provisional application No. 61/510,719, filed on Jul. 22, 2011.

(51) Int. Cl.
| | | |
|---|---|---|
| *H05K 1/02* | (2006.01) | |
| *H05K 1/18* | (2006.01) | |
| *H05K 3/34* | (2006.01) | |
| *H05K 3/46* | (2006.01) | |

(52) U.S. Cl.
CPC .............. *H05K 1/183* (2013.01); *H05K 3/4697* (2013.01); *H05K 3/3452* (2013.01); *H05K 3/4691* (2013.01); *H05K 2201/09036* (2013.01); *H05K 2201/09063* (2013.01); *H05K 2201/09127* (2013.01); *H05K 2201/09136* (2013.01); *H05K 2201/09854* (2013.01); *Y10T 29/49128* (2015.01)

(58) Field of Classification Search
CPC ...... H05K 1/0271; H05K 1/142; H05K 1/183
USPC ......... 174/250, 252, 255, 258, 261, 262, 268; 29/835, 831
See application file for complete search history.

(56) References Cited

U.S. PATENT DOCUMENTS

| | | | | |
|---|---|---|---|---|
| 6,205,028 B1* | 3/2001 | Matsumura | .................... | 361/720 |
| 6,372,999 B1* | 4/2002 | Bjorndahl et al. | ............ | 174/262 |
| 7,286,729 B2* | 10/2007 | Minamio et al. | ................ | 385/14 |
| 8,186,046 B2* | 5/2012 | Tanaka | ............. | 29/832 |
| 8,519,270 B2* | 8/2013 | Chang | ................ | 174/250 |
| 8,735,739 B2* | 5/2014 | Ishihara et al. | ................ | 174/261 |
| 2009/0014865 A1* | 1/2009 | Chou et al. | .................... | 257/712 |
| 2010/0252303 A1* | 10/2010 | Chang | ................ | 174/251 |
| 2010/0288540 A1* | 11/2010 | Honjo et al. | .................. | 174/255 |
| 2012/0012371 A1* | 1/2012 | Kita | ................ | 174/255 |
| 2012/0063094 A1* | 3/2012 | Gaynes et al. | ................ | 361/707 |
| 2012/0217049 A1* | 8/2012 | Hanai et al. | .................. | 174/260 |
| 2013/0299223 A1* | 11/2013 | Yoo et al. | ................ | 174/259 |
| 2013/0305530 A1* | 11/2013 | Ishihara et al. | ................ | 29/847 |

FOREIGN PATENT DOCUMENTS

JP    2008-034589    2/2008

* cited by examiner

*Primary Examiner* — Jeremy C Norris
*Assistant Examiner* — Nathan Milakovich
(74) *Attorney, Agent, or Firm* — Oblon, McClelland, Maier & Neustadt, L.L.P.

(57) ABSTRACT

A wiring board has a laminated structure having a recessed portion on a first-surface side of the laminated structure and a solder resist layer on a second-surface side of the laminated structure on the opposite side of the first-surface side. The laminated structure has a first-surface side pad formed in the bottom of the recessed portion and a second-surface side pad formed on the second-surface side of the laminated structure, the solder resist layer has a first opening portion and a second opening portion formed in the solder resist layer, the first opening portion is exposing the second-surface side pad, the second opening portion is formed on a back face of the recessed portion, and the back face of the recessed portion does not include the second-surface side pad.

20 Claims, 36 Drawing Sheets

| Sample | Opening Portion in 2nd-Surface Side Solder Resist |
|---|---|
| Sample #11 | Present |
| Sample #12 | Not Present |

FIG. 23

| Sample | Opening Portion in 2nd-Surface Side Solder Resist | NPTH (Non-Plated Through Hole) |
|---|---|---|
| Sample #21 | Present | Present |
| Sample #22 | Not Present | Present | om
WIRING BOARD AND METHOD FOR MANUFACTURING THE SAME

CROSS-REFERENCE TO RELATED APPLICATIONS

The present application is based on and claims the benefit of priority to U.S. Application No. 61/510,719, filed Jul. 22, 2011, the entire contents of which are incorporated herein by reference.

BACKGROUND OF THE INVENTION

1. Field of the Invention

The present invention relates to a wiring board and its manufacturing method.

2. Discussion of the Background

In Japanese Laid-Open Patent Publication No. 2008-34589, a wiring board and its manufacturing method are described, where a recessed portion that opens on one side is formed and multiple pads are formed on the bottom of the recessed portion. The contents of Japanese Laid-Open Patent Publication No. 2008-34589 are incorporated herein by reference in this application.

SUMMARY OF THE INVENTION

According to one aspect of the present invention, a wiring board has a laminated structure having a recessed portion on a first-surface side of the laminated structure and a solder resist layer on a second-surface side of the laminated structure on the opposite side of the first-surface side. The laminated structure has a first-surface side pad formed in the bottom of the recessed portion and a second-surface side pad formed on the second-surface side of the laminated structure, the solder resist layer has a first opening portion and a second opening portion formed in the solder resist layer, the first opening portion is exposing the second-surface side pad, the second opening portion is formed on a back face of the recessed portion, and the back face of the recessed portion does not include the second-surface side pad.

According to another aspect of the present invention, a wiring board has a laminated structure having a recessed portion on a first surface of the laminated structure and a pad formed to mount an electronic device in the bottom of the recessed portion. The laminated structure has a non-plated through hole penetrating from the bottom of the recessed portion to a second surface of the laminated structure on the opposite side of the first surface of the laminated structure.

According to yet another aspect of the present invention, a method for manufacturing a wiring board includes preparing a laminated structure having a first-surface side pad formed to mount an electronic device in the laminated structure, forming a recessed portion on a first surface of the laminated structure such that the first-surface side pad is exposed in the bottom of the recessed portion, forming a second-surface side pad on a second surface of the laminated structure on the opposite side of the first surface of the laminated structure, forming a solder resist layer on the second surface of the laminated structure, forming a first opening portion through the solder resist layer such that the second-surface side pad is exposed, and forming a second opening portion through the solder resist layer such that a portion of the second surface of the laminated structure corresponding to a back face of the recessed portion is exposed. The back face of the recessed portion does not include the second-surface side pad.

According to still another aspect of the present invention, a method for manufacturing a wiring board includes preparing a laminated structure having a first-surface side pad formed to mount an electronic device in the laminated structure, forming a recessed portion on a first surface of the laminated structure such that the first-surface side pad is exposed in the bottom of the recessed portion, and forming a non-plated through hole in the laminated structure such that the non-plated through hole penetrates from the bottom of the recessed portion to a second surface of the laminated structure on the opposite side of the first surface of the laminated structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 23 is a table showing structures of samples in a simulation of the second embodiment;

DETAILED DESCRIPTION OF THE EMBODIMENTS

Figure 1:
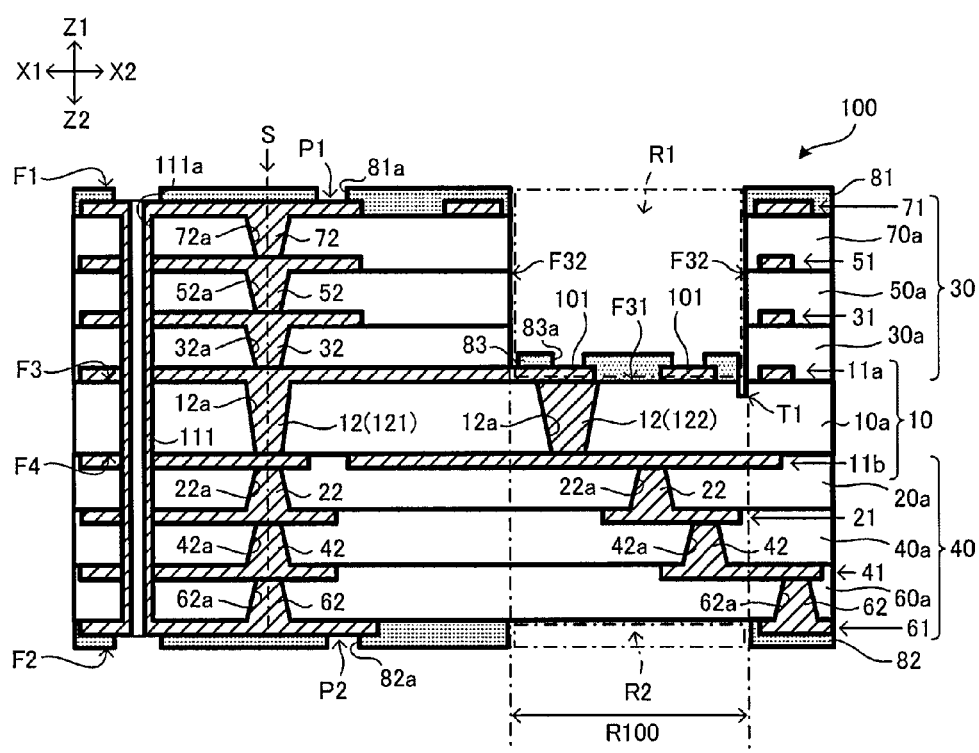
FIG. 1 is a cross-sectional view of a wiring board according to a first embodiment of the present invention.

The embodiments will now be described with reference to the accompanying drawings, wherein like reference numerals designate corresponding or identical elements throughout the various drawings.

Arrows (Z1, Z2) in the drawings each indicate a lamination direction of a wiring board (or a thickness direction of the wiring board) corresponding to a direction along a normal line to the main surfaces (upper and lower surfaces) of the wiring board. On the other hand, arrows (X1, X2) and (Y1, Y2) each indicate a direction perpendicular to a lamination direction (or a direction to a side of each layer). Main surfaces of a wiring board are on the X-Y plane. Also, side surfaces of a wiring board are on the X-Z plane or the Y-Z plane.

In a lamination direction, a side closer to the core is referred to as a lower layer (or an inner side) and a side farther from the core is referred to as an upper layer (or an outer side). In laminated sections, tiers, a unit of which is a pair of an insulation layer and a conductive layer formed on the insulation layer, are formed by alternately laminating a conductive layer and an insulation layer (interlayer insulation layer). On both sides of a core substrate, an insulation layer and a conductive layer on the core substrate are referred to as a first tier, and further upper layers are consecutively referred to as a second tier, a third tier, and so forth. In addition, on the X-Y plane, a side farther from a cavity (in particular, its gravity center) is referred to as outside, and a side closer to the cavity as inside. "Directly on" means direction Z (Z1 side or Z2 side).

A conductive layer is such a layer that is formed with one or multiple conductive patterns. A conductive layer may include a conductive pattern that forms an electrical circuit, such as wiring (including ground), a pad, a land or the like, or it may include a planar conductive pattern that does not form an electrical circuit.

Opening portions include slits, cuts or the like in addition to holes and grooves. Holes are not limited to penetrating holes, and non-penetrating holes are also called holes. Holes include via holes and through holes. In the following, the conductor formed in a via hole (wall or bottom surface) is referred to as a via conductor, and the conductor formed in a through hole (wall surface) is referred to as a through-hole conductor.

Plating includes wet plating such as electrolytic plating as well as dry plating such as PVD (physical vapor deposition) and CVD (chemical vapor deposition).

First Embodiment

Wiring board 100 of the present embodiment is a printed wiring board. As shown in FIG. 1, wiring board 100 has wiring board 10, insulation layers (20a, 30a, 40a, 50a, 60a, 70a), conductive layers (21, 31, 41, 51, 61, 71) and via conductors (22, 32, 42, 52, 62, 72). In the following, one of the upper and lower surfaces (two main surfaces) of wiring board 100 is referred to as first surface (F1) and the other as second surface (F2).

Wiring board 100 has cavity (R1) (recessed portion) which opens on the first-surface (F1) side. Also, on bottom surface (F31) of cavity (R1), wiring board 100 has pad 101 (first-surface (F1) side pad) for mounting an electronic component.

Wiring board 100 has solder resist 81 (first-surface side outer solder resist) on the first-surface (F1) side outer layer, and solder resist 82 (second-surface side outer solder resist) on the second-surface (F2) side outer layer. Also, wiring board 100 has solder resist 83 (first-surface side inner solder resist) on bottom surface (F31) of cavity (R1) (recessed portion). Solder resist 81 (outer solder resist) and solder resist 83 (inner solder resist) on the first-surface (F1) side may be formed simultaneously or separately.

Wiring board 10 has insulative substrate (10a), conductive layers (11a, 11b) and via conductor 12. Insulative substrate (10a) becomes the core substrate of wiring board 100. In the following, one of upper and lower surfaces (two main surfaces) of insulative substrate (10a) is referred to as third surface (F3) and the other as fourth surface (F4). Third surface (F3) faces the same direction as first surface (F1).

Conductive layer (11a) is formed on third surface (F3) of insulative substrate (10a), and conductive layer (11b) is formed on fourth surface (F4) of insulative substrate (10a). Via hole (12a) which penetrates through insulative substrate (10a) is formed in insulative substrate (10a). Via conductor 12 is formed by filling copper plating, for example, in via hole (12a). Multiple via conductors 12 formed in insulative substrate (10a) include via conductor 121 of filled-stack structure (S) and via conductor 122 electrically connected to pad 101 in cavity (R1). Pad 101 is positioned directly on via conductor 122 and connected directly to via conductor 122.

Buildup section 30 (first laminated section) is formed on third surface (F3) of insulative substrate (10a), and buildup section 40 (second laminated section) is formed on fourth surface (F4) of insulative substrate (10a). Buildup section 30 is formed by alternately laminating three insulation layers (30a, 50a, 70a) (each an interlayer insulation layer) and three conductive layers (31, 51, 71). Also, buildup section 40 is formed by alternately laminating three insulation layers (20a, 40a, 60a) (each an interlayer insulation layer) and three conductive layers (21, 41, 61). Solder resist 81 is formed on buildup section 30, and solder resist 82 is formed on buildup section 40.

In the present embodiment, the number of tiers in buildup section 30 and the number of tiers in buildup section 40 are the same (three). Specifically, insulation layers (20a, 30a) and conductive layers (21, 31) are the first tiers, insulation layers (40a, 50a) and conductive layers (41, 51) are the second tiers, and insulation layers (60a, 70a) and conductive layers (61, 71) are the third tiers.

Conductive layer 71 is the outermost conductive layer on the third-surface (F3) side, and conductive layer 61 is the outermost conductive layer on the fourth-surface (F4) side. Solder resists (81, 82) are formed respectively on conductive layers (71, 61). As described, solder resist 82 (second-surface side solder resist) is formed on second surface (F2) in wiring board 100 of the present embodiment.

Opening portions (81a, 82a) are respectively formed in solder resists (81, 82). Therefore, a predetermined portion of conductive layer 71 (the portion positioned in opening portion 81a) is exposed without being covered by solder resist 81, and becomes pad (P1). Also, a predetermined portion of conductive layer 61 (the portion positioned in opening portion 82a) becomes pad (P2). In wiring board 100 of the present embodiment, pad (P1) (another pad on the first-surface side) is formed on buildup section 30 (first laminated section), and pad (P2) (second-surface side pad) is formed on second surface (F2). Solder resist 82 is the second-surface side solder resist. Also, opening portion (82a) formed in solder resist 82 corresponds to a first opening portion and exposes pad (P2). Opening portion (82a) corresponds to an opening portion for pad (P2) (second-surface side pad).

Pad (P1) becomes an external connection terminal for mounting an electronic component, for example, and pad (P2) becomes an external connection terminal for electrically connecting another wiring board, for example. However, the usage of pads (P1, P2) is not limited to such, and they may be used in any other way. Instead of solder resists (81, 82), coverlays may also be used.

Insulative substrate (10a) is made of a rigid substrate, for example. Insulative substrate (10a) is made by impregnating glass cloth (core material) with epoxy resin (hereinafter referred to as glass epoxy), for example. The core material has a lower thermal expansion coefficient than the primary material (epoxy resin in the present embodiment). As for the core material, for example, glass fiber (glass cloth or glass non-woven fabric, for example), aramid fiber (aramid non-woven fabric, for example), and inorganic material such as silica or the like are considered preferable. However, the shape, thickness, material and the like of insulative substrate (10a) are basically determined freely. For example, polyester resin, bismaleimide triazine resin (BT resin), imide resin (polyimide), phenol resin, allyl polyphenylene ether resin (A-PPE resin) or the like may also be used instead of epoxy resin. Insulative substrate (10a) may be formed with multiple layers made of different materials. Alternatively, insulative substrate (10a) may be made of a flexible substrate, for example.

Insulation layers (20a, 30a, 40a, 50a, 60a, 70a) are each made of epoxy resin, for example. In the present embodiment, insulation layer (20a) and the others are made of resin without core material. However, that is not the only option, and the shape, thickness, material and the like of insulation layer (20a) and the others are basically determined freely. For example, the above insulation layer (20a) and the others in buildup sections (30, 40) may contain core material.

Conductive layers (11a, 11b, 21, 31, 41, 51, 61, 71) each have a laminated structure of copper foil and copper plating, for example. However, the material of conductive layers (11a) and the others is not limited specifically and may be determined freely.

Via conductor 12 is made of copper plating, for example. The shape of via conductor 12 is a tapered column (truncated cone) which tapers with a diameter increasing toward the Z1 side, for example. However, that is not the only option, and the material and shape of via conductor 12 are not limited specifically.

Via holes (22a, 32a, 42a, 52a, 62a, 72a) are formed respectively in insulation layers (20a, 30a, 40a, 50a, 60a, 70a), and via conductors (22, 32, 42, 52, 62, 72) are respectively formed by filling copper plating, for example, in via hole (22a) and the others. The shape of via conductor 22 and the others is a tapered column (truncated cone), for example, which tapers with a diameter increasing toward their respective upper layers. However, that is not the only option, and any material and shape may be employed for via conductor 22 and the others.

In wiring board 100, via conductor 12 (in particular, via conductor 121) and via conductors (22, 32, 42, 52, 62, 72) (each a filled conductor) are stacked on both sides of wiring board 10 (third-surface (F3) side and fourth-surface (F4) side) so that filled-stack structure (S) is extended along directions Z. Adjacent via conductors are adhered to (contact) each other, and become conductive with each other. Filled-stack structure (S) electrically connects conductive layers on both surfaces of wiring board 100, namely, conductive layer 71 on the first-surface (F1) side and conductive layer 61 on the second-surface (F2) side.

Filled-stack structure (S) is a so-called full-stack structure, where the filled conductors through all the layers are stacked. Thus, it is easier to secure wiring space, and the design flexibility of wiring patterns is enhanced. Also, since wiring in direction X or direction Y can be omitted, wiring length is reduced for interlayer connections. The position and number of filled-stack structures (S) may be determined freely. For example, it is an option to have multiple filled-stack structures (S).

In wiring board 100, through hole (111a) which penetrates through wiring board 100 is formed, and by forming copper plating, for example, on the wall surface of through-hole (111a), through-hole conductor 111 is formed. In the present embodiment, cavity (R1) (recessed portion) that opens on one side (first-surface (F1) side) of wiring board 100 is formed in buildup section 30, as shown in FIG. 1. Wall surface (F32) of cavity (R1) is made from a cut surface of two or more interlayer insulation layers (insulation layers (30a, 50a, 70a)) and corresponds to a side surface of buildup section 30. The shape of cavity (R1) is substantially a rectangle in the present embodiment. However, cavity (R1) is not limited to such a shape and may be in any other shape. Also, the number of cavities (R1) to be formed in wiring board 100 is not limited specifically (see later-described FIGS. 29A, 29B). In addition, the shape of cavity (R1) may be determined freely.

Cavity (R1) is formed as a hole in wiring board 100 of the present embodiment. Cavity (R1) reaches third surface (F3) of wiring board 10 from first surface (F1) of wiring board 100. The depth of cavity (R1) is preferred to be determined according to the height of a component to be accommodated in cavity (R1). However, if cavity (R1) is set shallower, it is thought to be easier to reduce warping in wiring board 100.

On bottom surface (F31) of cavity (R1), groove (T1) shaped in a rectangular ring, for example, is formed along substantially the entire wall surface (F32) of cavity (R1) (its four sides). Pad 101 is positioned in a region on the bottom surface (F31) surrounded by groove (T1). The depth of groove (T1) is approximately 20 μm, for example. The width of groove (T1) (groove portion (R11)) is approximately 100 μm, for example. However, the shape and dimensions of groove (T1) may be determined freely.

In the present embodiment, groove (T1) is formed in insulative substrate (10a) (rigid substrate containing core material). Accordingly, it is easier to adjust the depth of groove (T1) because of the core material. Also, since insulative substrate (10a) is a rigid substrate containing core material, it is easier to maintain its surface flatness for forming pads and solder resist 83.

In the present embodiment, groove (T1) is formed near wall surface (F32) of cavity (R1). Wiring board 100 has pad 101 on bottom surface (F31) of cavity (R1) in a position farther from wall surface (F32) than groove (T1) is.

Figure 2A:
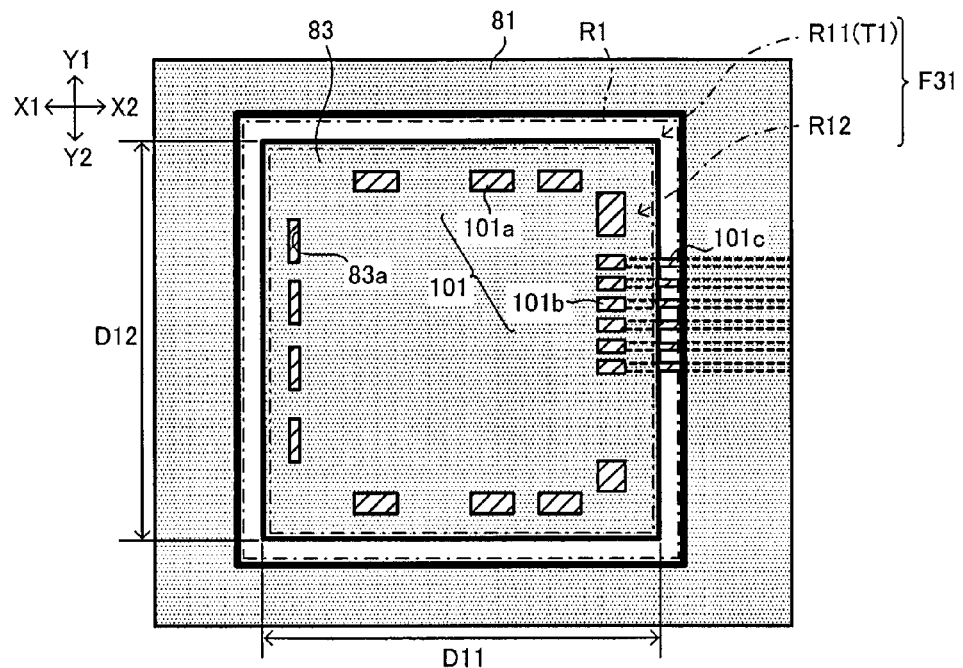
FIG. 2A is a plan view showing an outer layer on one side of a wiring board according to the first embodiment.

FIG. 2A is a magnified view of cavity (R1). In the following, a region on bottom surface (F31) of cavity (R1) where groove (T1) is formed is referred to as groove portion (R11), and the rest is referred to as non-groove portion (R12). Groove portion (R11) is positioned along the periphery of cavity (R1), and non-groove portion (R12) is positioned inside groove portion (R11). Widths (D11, D12) of non-groove portion (R12) surrounded by groove (T1) are preferred to be determined according to the size of a component to be accommodated in cavity (R1).

As shown in FIG. 2A, wiring board 100 has pads 101 on non-groove portion (R12) surrounded by groove (T1). Pads 101 include multiple pads (101a) and multiple pads (101b), and wiring board 100 includes multiple conductive patterns (101c) electrically connected to pads (101b). Pads 101 and conductive patterns (101c) are included in conductive layer (11a). In the present embodiment, conductive patterns (101c) each correspond to wiring electrically connecting a terminal (pad 101b) in cavity (R1) and another circuit outside cavity (R1).

Figure 18A:
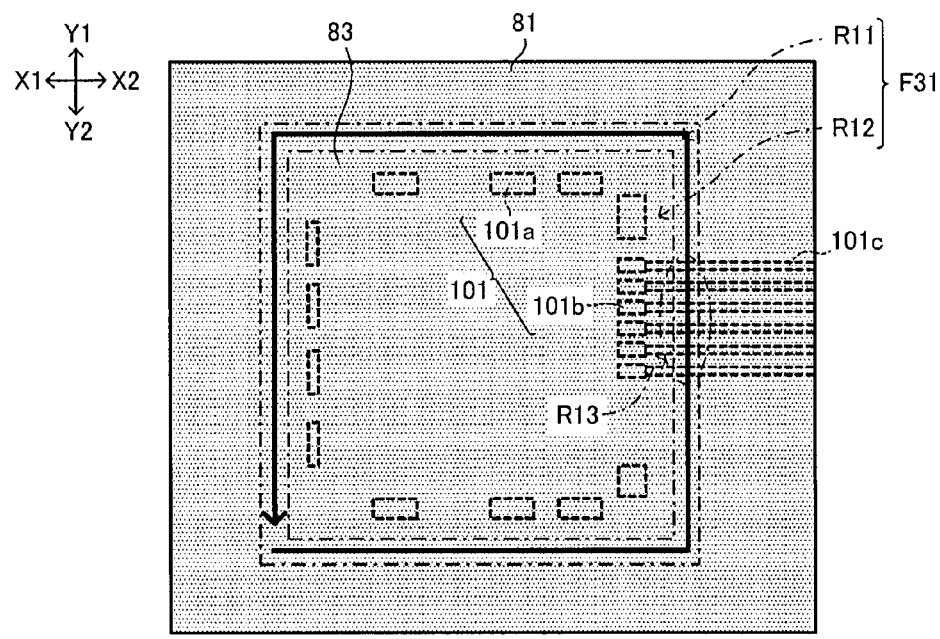
FIG. 18A is, regarding the manufacturing method shown in FIG. 10, a view to illustrate a step for irradiating a laser.

Conductive patterns (101c) are each formed in non-groove portion (R12) (see later-described FIGS. 18A, 18B). Namely, conductive patterns (101c) are each formed in a region on bottom surface (F31) of cavity (R1) where groove (T1) is not formed. In the present embodiment, conductive patterns (101c) are each formed in a linear shape extended along direction X, and a portion of groove (T1) and conductive pattern (101c) are alternately positioned along direction Y. The L/S (width/space) of conductive patterns (101c) is approximately 50 μm/approximately 50 μm, for example.

Since multiple conductive patterns (101c) are positioned to be divided by groove (T1) in the present embodiment, short circuiting due to solder bridging or the like seldom occurs between conductive patterns (101c). As a result, it is easier to form fine wiring.

Figure 2B:
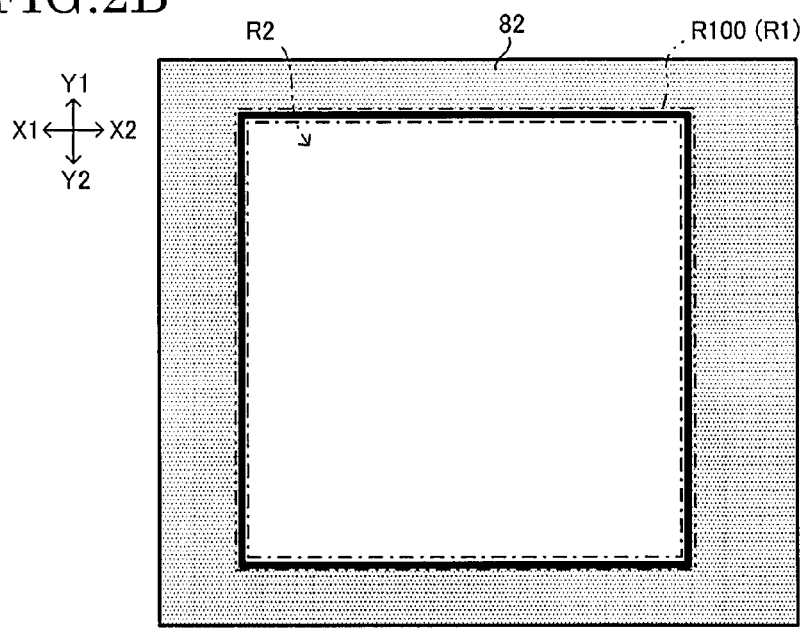
FIG. 2B is a plan view showing an outer layer on the other side of a wiring board according to the first embodiment.

Solder resist 82 on the second-surface (F2) side (second-surface side solder resist) has opening portion (R2) which is not for pad (P2) (second-surface side pad) in addition to opening portion (82a) which is for pad (P2) (second-surface side pad). The opening area of opening portion (R2) (second opening portion) is greater than the opening area of opening portion (82a) (first opening portion). Opening portion (R2) corresponds to the second opening portion and is positioned on the back face (region R100) of cavity (R1) (recessed portion). In addition, opening portion (R2) is positioned in a region that excludes pad (P2) (second-surface side pad). In the present embodiment, opening portion (R2) is formed in region (R100) corresponding to cavity (R1) (recessed portion) on the first-surface (F1) side as shown in FIG. 2B. Also, no pad is formed in opening portion (R2) in the present embodiment. Namely, opening portion (R2) is a non-pad region.

In the present embodiment, the depth of opening portion (R2) is the same as the thickness of solder resist 82. However, that is not the only option, and the depth of opening portion (R2) may be determined freely (see FIGS. 31A, 31B).

As shown in FIG. 1, in addition to solder resists (81, 82) (outer solder resists) formed on their respective main surfaces, wiring board 100 has solder resist 83 (inner solder resist) on non-groove portion (R12) of bottom surface (F31) of cavity (R1). Solder resist 83 has opening portion (83a) corresponding to pad 101 so that pad 101 is exposed in opening portion (83a). Solder resist 83 may be formed simultaneously with solder resist 81.

Figure 3:
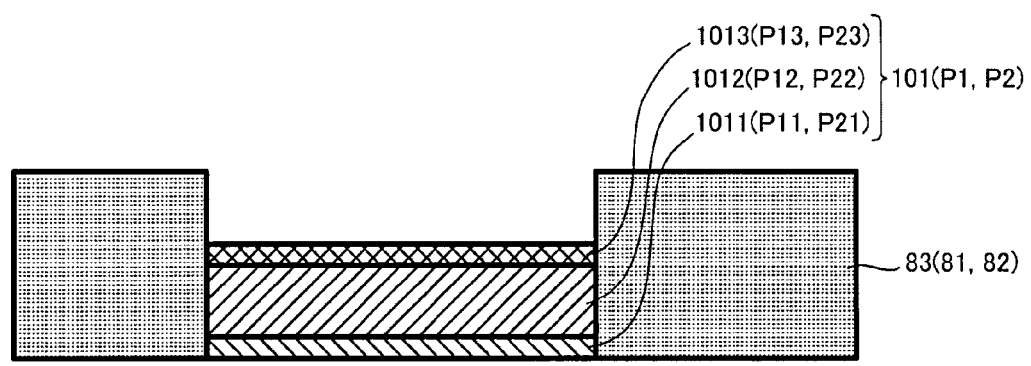
FIG. 3 is a view showing the structure of a pad in a wiring board according to the first embodiment.

As shown in FIG. 3, wiring board 100 has anticorrosion layer 1013 on a surface of pad 101 formed on the bottom surface of cavity (R1), anticorrosion layer (P13) on a surface of pad (P1) formed on a main surface (first-surface (F1) side main surface) outside cavity (R1), and anticorrosion layer (P23) on a surface of pad (P2) formed on the opposite main surface (second-surface (F2) side main surface).

More specifically, pad 101 is triple-layered with copper foil 1011, plated layer 1012, and anticorrosion layer 1013 laminated from the bottom up in that order. Pad (P1) is triple-layered with copper foil (P11), plated layer (P12) and anticorrosion layer (P13) laminated from the bottom up in that order. Pad (P2) is also triple-layered with copper foil (P21), plated layer (P22) and anticorrosion layer (P23) laminated from the bottom up in that order.

Anticorrosion layers (1013, P13, P23) are each made of the same material (Ni/Au film, organic preservative film or the like) by electrolytic plating or OSP treatment or the like. Conductive layers (11a, 61, 71) may have an anticorrosion layer only on an exposed surface (pad surface or the like), or may have an anticorrosion layer on the entire surface.

Figure 4A:
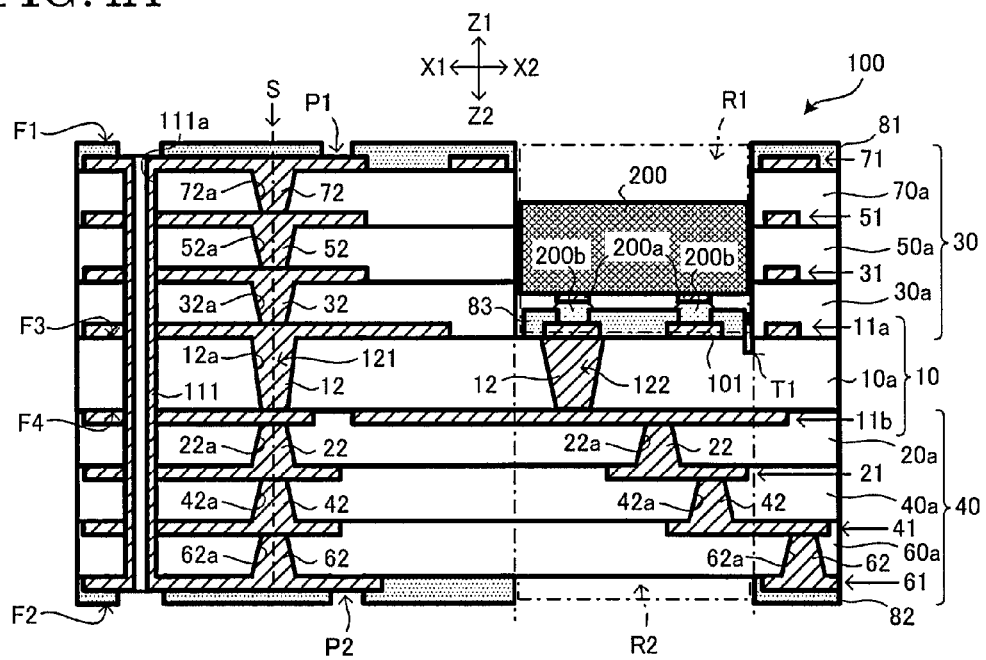
FIG. 4A is a view showing an example where an electronic component is mounted on a wiring board of the first embodiment.

As shown in FIG. 4A, for example, electronic component 200 having electrode (200a) is accommodated in cavity (R1). Also, solder (200b) is formed on pad 101 in cavity (R1) (specifically, on anticorrosion layer 1013 shown in FIG. 3). Then, pad 101 and electronic component 200 are electrically connected to each other by solder (200b). However, it is not limited to an electronic component that is electrically connected to pad 101.

Figure 4B:
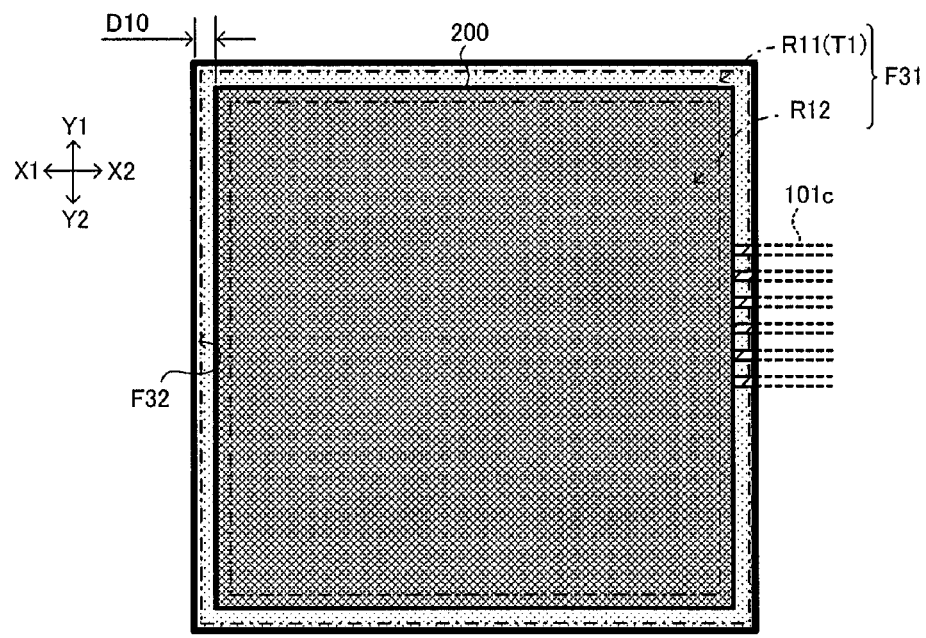
FIG. 4B is a plan view of the wiring board shown in FIG. 4A.

Electronic component 200 is positioned in such a way that its entire side surface (all four sides) are on groove portion (R11) as shown in FIG. 4B, for example. Gap (D10) (half the clearance) between wall surface (F32) of cavity (R1) and electronic component 200 is approximately 20 mm, for example. However, that is not the only option, and the position and dimensions of electronic component 200 may be selected freely.

In wiring board 100 of the present embodiment, since groove (T1) is formed on bottom surface (F31) near side surface (F23) of cavity (R1), groove (T1) will work as a receptor if the resin of buildup section 30 flows out to cavity (R1), and thus protrusions are seldom formed. Accordingly, the electrical connection reliability of pad 101 is enhanced without enlarging gap (D10). As a result, it is easier to reduce gap (D10) (or clearance) between electronic component 200 and wall surface (F32) of cavity (R1).

On the second-surface (F2) side outer layer of wiring board 100 of the present embodiment, solder resist 82 is formed to have opening portion (R2) in region (R100) corresponding to cavity (R1) (recessed portion) on the first-surface (F1) side (see FIG. 2B). When solder resist 82 has opening portion (R2) corresponding to cavity (R1) (recessed portion), warping is suppressed in wiring board 100. In the following, that situation is described with reference to FIG. 5 and other drawings.

Figure 7A:
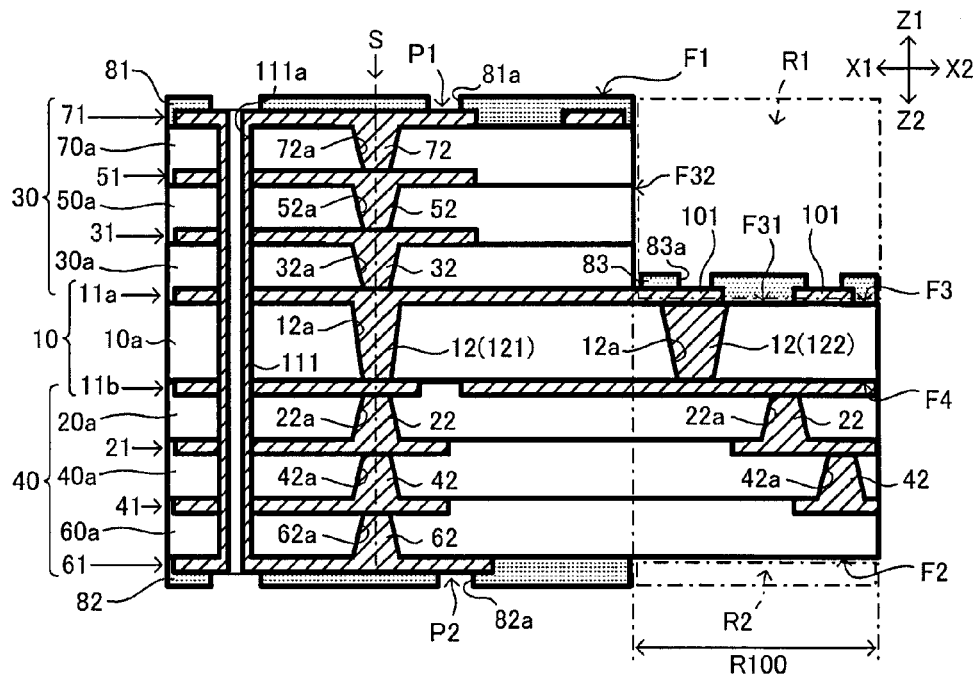
FIG. 7A is a cross-sectional view showing the structure of a first sample in the simulation of the first embodiment.
Figure 7B:
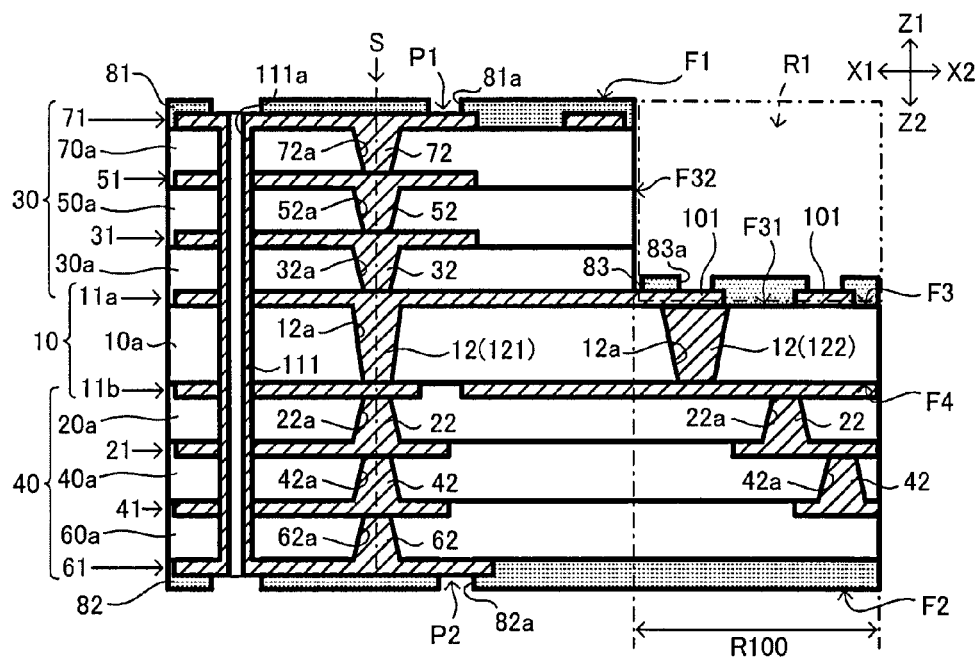
FIG. 7B is a cross-sectional view showing the structure of a second sample in the simulation of the first embodiment.

First, a simulation conducted by the inventor(s) is described. Structures of samples (#11, #12) in the simulation are shown in FIGS. 5~7B. In FIGS. 7A and 7B, the same reference numbers are applied to elements identical to those shown in FIG. 1.

Figures 5, 6:
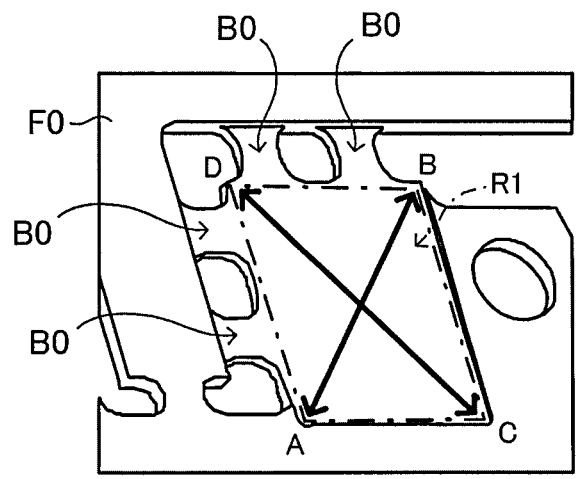
FIG. 5 is a perspective view showing the structure of a sample in a simulation of the first embodiment.
FIG. 6 is a table showing structures of samples in the simulation of the first embodiment.

As shown in FIG. 5, cavity (R1) is connected to frame (F0) by bridge (B9) in samples (#11, #12) in the present simulation. The opening shape of cavity (R1) in samples (#11, #12) is a 25 mm×25 mm square in the present simulation.

As shown in FIG. 6, solder resist 82 has opening portion (R2) in region (R100) corresponding to cavity (R1) (recessed portion) in sample #11, whereas in sample #12, solder resist 82 does not have opening portion (R2). As shown in FIG. 7A, sample #11 has substantially the same structure as wiring board 100 of the present embodiment shown in FIG. 1. Sample #12 has the same structure as sample #11 except that solder resist 82 does not have opening portion (R2) as shown in FIG. 7B.

In the present simulation, a 3D linear static analysis was conducted on each of samples (#11, #12) using a commercially available software. Specifically, the amount of warping in each sample was measured when the thermal load was changed from 260° C. to 30° C.

Figure 8A:
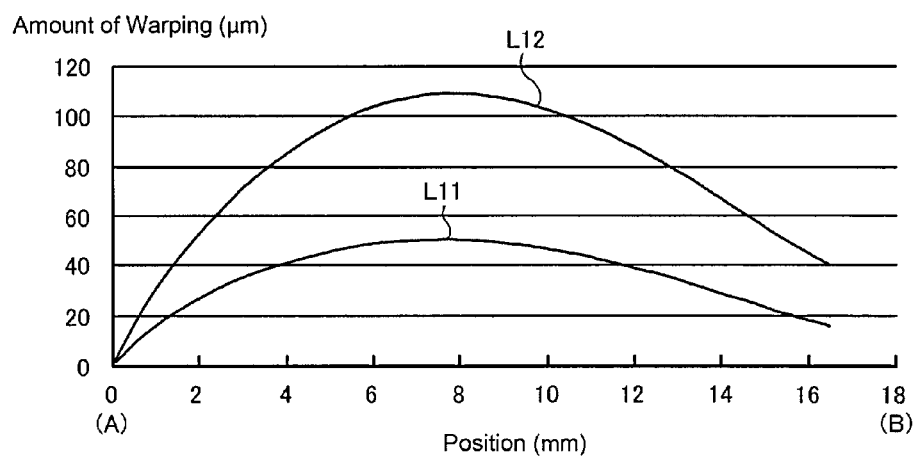
FIG. 8A is, regarding each sample in the simulation of the first embodiment, a graph showing simulation results of the amount of warping in the A-B direction in FIG. 5.
Figure 8B:
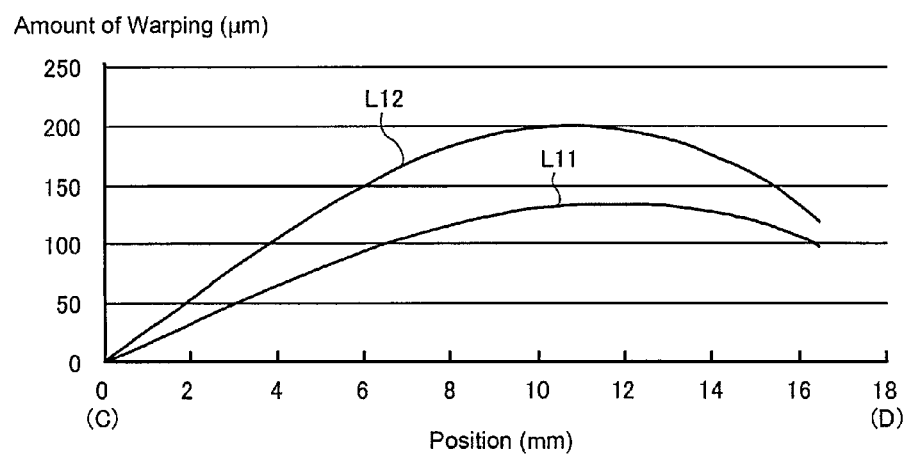
FIG. 8B is, regarding each sample in the simulation of the first embodiment, a graph showing simulation results of the amount of warping in the C-D direction in FIG. 5.

FIG. 8A shows simulation results of the amount of warping in samples (#11, #12) in the A-B direction in FIG. 5. FIG. 8B shows simulation results of the amount of warping in samples (#11, #12) in the C-D direction in FIG. 5. In FIGS. 8A and 8B, line (L11) shows the data on sample (#11), and line (L12) shows the data on sample (#12).

Figure 9:
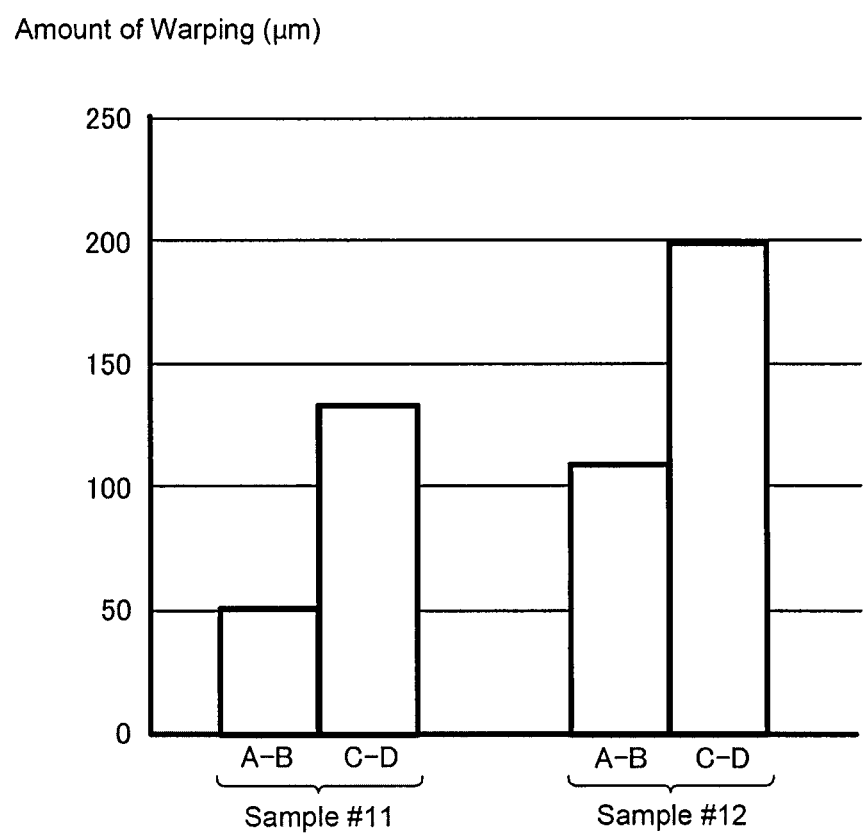
FIG. 9 is, regarding each sample in the simulation of the first embodiment, a graph showing the maximum amount of warping.

FIG. 9 is a graph showing the maximum amount of warping in each of samples (#11, #12).

As shown in FIGS. 8A, 8B and 9, the amount of warping in sample (#11) is smaller than in sample (#12). Namely, when solder resist 82 has opening portion (R2) in region (R100) corresponding to cavity (R1) (recessed portion), warping is suppressed in wiring board 100. Without being bound by a theory, the reason is thought to be as follows: the difference becomes smaller in the thermal expansion coefficient on one side (third-surface (F3) side) of insulative substrate (10a) (core substrate) with cavity (R1) and the thermal expansion coefficient on the other side (fourth-surface (F4) side) of insulative substrate (10a) (core substrate) without cavity (R1).

Also, in wiring board 100 of the present embodiment, imbalance is reduced on the upper and lower sides in the region of cavity (R1) because solder resist 82 (second-surface side solder resist) has opening (R2) in region (R100) corresponding to cavity (R1) (recessed portion). Moreover, upper and lower balances are not disturbed, either, in regions other than cavity (R1). Namely, effects of suppressing warping are expected on the entire substrate surface.

In wiring board 100 of the present embodiment, warping is suppressed in wiring board 100, thus electrical connection reliability is enhanced at pad 101 formed on bottom surface (F31) of cavity (R1).

In the following, a method for manufacturing wiring board 100 according to the present embodiment is described. The above wiring board 100 is manufactured by the process shown in FIG. 10, for example.

Figure 11:
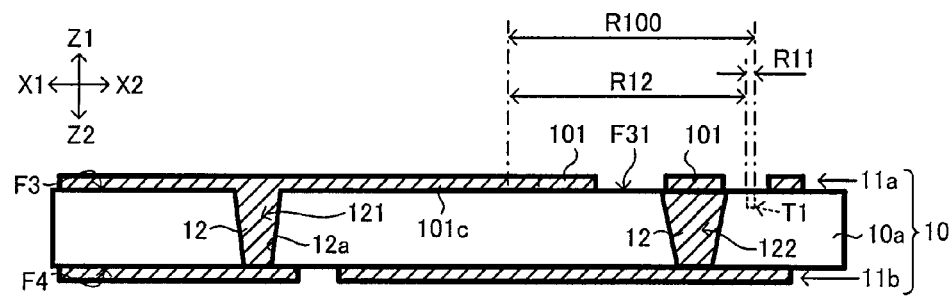
FIG. 11 is, regarding the manufacturing method shown in FIG. 10, a view to illustrate a step for preparing a core substrate (insulation layer where conductive layers are formed on its main surfaces)

In step (S11), wiring board 10 is prepared as shown in FIG. 11. Wiring board 10 is formed with insulative substrate (10a), conductive layers (11a, 11b) and via conductor 12. Via conductor 12 is a filled conductor.

Conductive layer (11a) is formed on third surface (F3) of insulative substrate (10a), and conductive layer (11b) is formed on fourth surface (F4) of insulative substrate (10a). However, conductive layer (11a) does not have a conductive pattern on the region corresponding to groove portion (R11) (see FIG. 2A) on a main surface (third surface (F3)) of insulative substrate (10a). As a result, insulative substrate (10a) is exposed in the region corresponding to groove portion (R11).

Wiring board 10 is formed by using a double-sided copper-clad laminate as a starting material, for example, then by using a laser, for example, to form a via hole in the laminate, performing copper panel plating, and patterning the conductive layers on both surfaces by a lithographic technique, for example. Insulative substrate (10a) is made of completely cured glass epoxy, for example.

Figure 10:
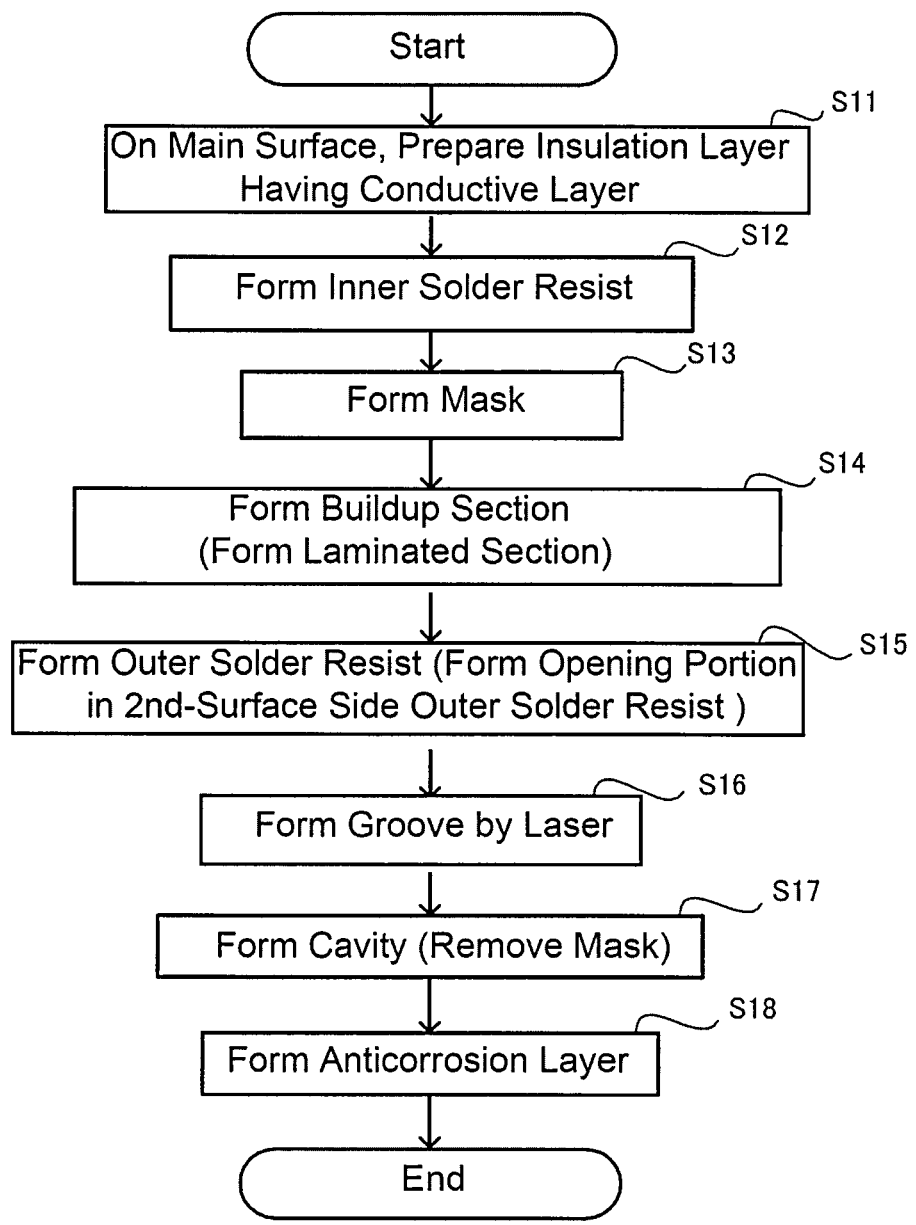
FIG. 10 is a flowchart showing a method for manufacturing a wiring board according to the first embodiment of the present invention.
Figure 12:
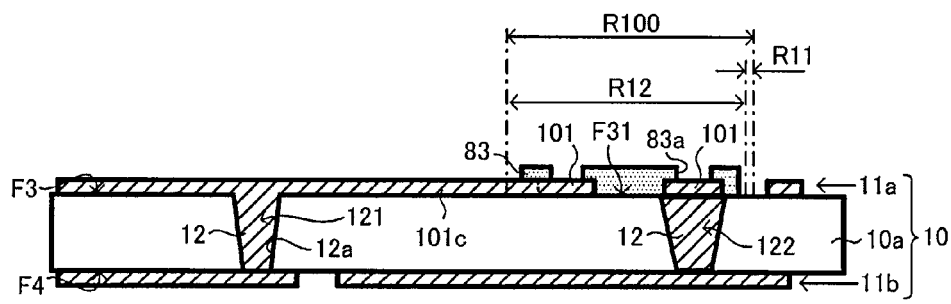
FIG. 12 is, regarding the manufacturing method shown in FIG. 10, a view to illustrate a step for forming an inner solder resist.

In step (S12) in FIG. 10, solder resist 83 (inner solder resist) for pad 101 is formed on the region corresponding to bottom surface (F31) (especially non-groove portion (R12)) of cavity (R1) as shown in FIG. 12, for example. Solder resist 83 is formed using screen printing, spray coating, roll coating, lamination or the like. At this stage, pad 101 does not have anticorrosion layer 1013. Anticorrosion layer 1013 on pad 101 is formed at the same time that anticorrosion layers (P13, P23) are formed on pads (P1, P2) in the present embodiment. By doing so, manufacturing efficiency improves.

Figure 13:
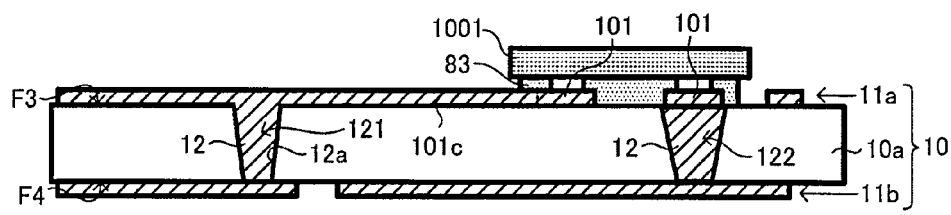
FIG. 13 is, regarding the manufacturing method shown in FIG. 10, a view to illustrate a step for forming a mask.

In step (S13) in FIG. 10, mask 1001 is formed on solder resist 83 as shown in FIG. 13, for example. Mask 1001 has substantially the same outline (X-Y plane) as solder resist 83, for example.

In step (S14) in FIG. 10, buildup is performed on both surfaces of wiring board 10. Accordingly, buildup sections (30, 40) (FIG. 1) are formed respectively on third surface (F3) and fourth surface (F4) of wiring board 10.

Figure 14:
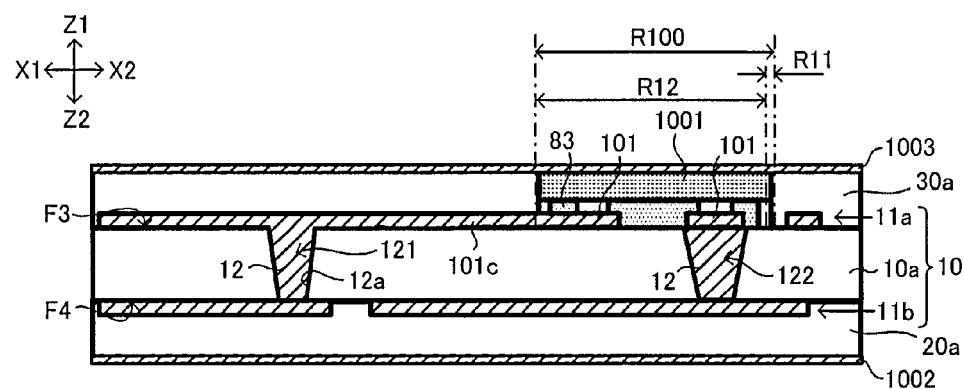
FIG. 14 is, regarding the manufacturing method shown in FIG. 10, a view to illustrate a first step for buildup.

Specifically, after mask 1001 is formed, copper foil 1002, insulation layer (20a), wiring board 10, insulation layer (30a), and copper foil 1003 are positioned in that order from the fourth-surface (F4) side, as shown in FIG. 14, for example. Here, insulation layer (30a) is positioned on a side of mask 1001, and their main surfaces are made substantially flat by setting the height of insulation layer (30a) and the height of mask 1001 to be substantially the same. Then, copper foil 1013 is formed on the substantially flat surface. Wiring board 10 is sandwiched by insulation layers (20a, 30a), which are then sandwiched by copper foils (1002, 1003). At this stage, insulation layers (20a, 30a) are prepreg (semicured adhesive sheets). However, RCF (resin-coated copper foil) or the like may also be used instead of prepreg.

The above laminate is thermally pressed in directions Z. Namely, pressing and thermal treatments are simultaneously conducted. By thermally pressing, prepreg (insulation layers (20a, 30a)) is cured and members are adhered to each other. As a result, the laminate is integrated. Here, pressing and thermal treatments may be conducted by dividing into multiple procedures. Thermal treatment and pressing may be conducted separately, but it is more efficient if they are conducted simultaneously. Another thermal treatment may be conducted for integration after the thermal pressing.

Figure 15:
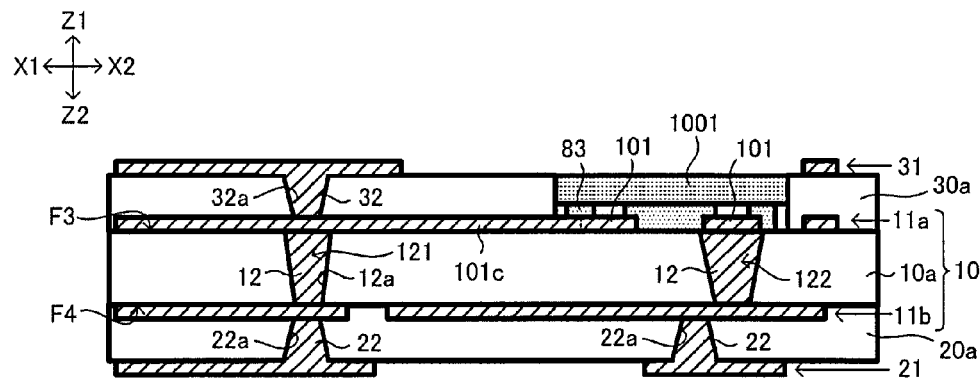
FIG. 15 is, regarding the manufacturing method shown in FIG. 10, a view to illustrate a second step for buildup.

A laser, for example, is used to form via hole (22a) in insulation layer (20a) and via hole (32a) is formed in insulation layer (30a) (see FIG. 15). Then, desmearing is performed if required.

Copper panel plating, for example, is performed to form plating on copper foils (1002, 1003) and in via holes (22a, 32a). Then, conductive layers on both surfaces are patterned by a lithographic technique, for example. Accordingly, via conductors (22, 32) and conductive layers (21, 31) are formed as shown in FIG. 15. Conductive layer 31 does not have a conductive pattern directly on the region (direction Z) corresponding to groove portion (R11). Via conductors (22, 32) are each a filled conductor, and they are stacked directly on via conductor 12 (directions Z).

Figure 16:
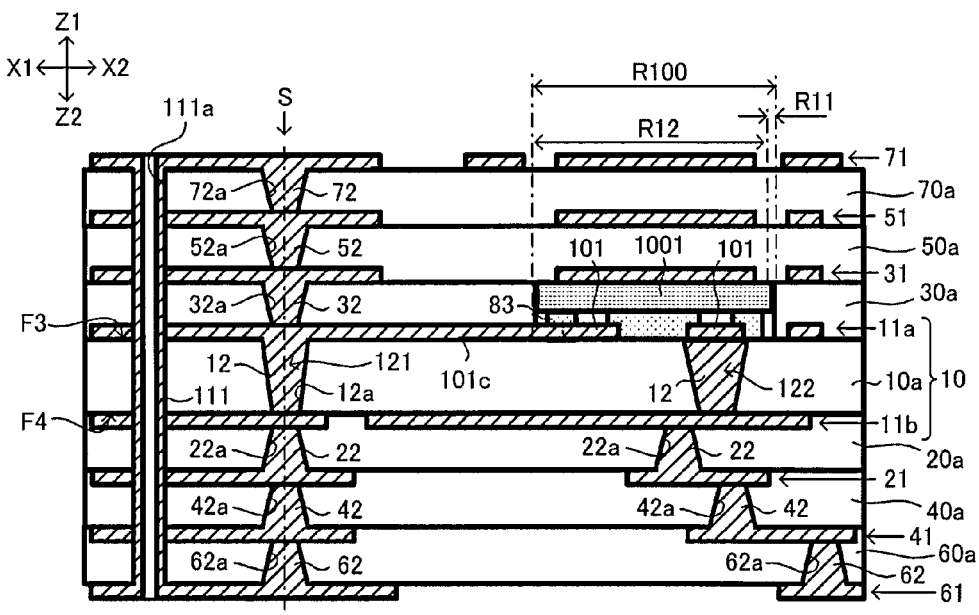
FIG. 16 is, regarding the manufacturing method shown in FIG. 10, a view to illustrate a third step for buildup.

The same as the first buildup layers (insulation layers (20a, 30a), conductive layers (21, 31) and via conductors (22, 32)), the second buildup layers (insulation layers (40a, 50a), conductive layers (41, 51) and via conductors (42, 52)), and the third buildup layers (insulation layers (60a, 70a), conductive layers (61, 71) and via conductors (62, 72)) are formed in that order as shown in FIG. 16. However, prior to panel plating for forming conductive layers (61, 71), through hole (111a) is formed using a drill, for example. Accordingly, through-hole conductor 111 is formed on the wall surface of through hole (111a) by the subsequent panel plating.

Conductive layers (51, 71) do not have a conductive pattern directly on the region (directions Z) corresponding to groove portion (R11). Namely, at this stage there is no conductor (especially a metal which tends to reflect laser light) directly on the region corresponding to groove portion (R11). Also, via conductors (42, 52, 62, 72) are each a filled conductor, and they are stacked directly on via conductor 12 (directions Z). They form filled-stack structure (S).

Accordingly, on third surface (F3) of wiring board 10 (on insulative substrate (10a) and conductive layer (11a)), buildup section 30 is formed with insulation layers (30a, 50a, 70a), and on fourth surface (F4) of wiring board 10 (on insulative substrate (10a) and conductive layer (11b)), buildup section 40 is formed with insulation layers (20a, 40a, 60a).

Figure 17:
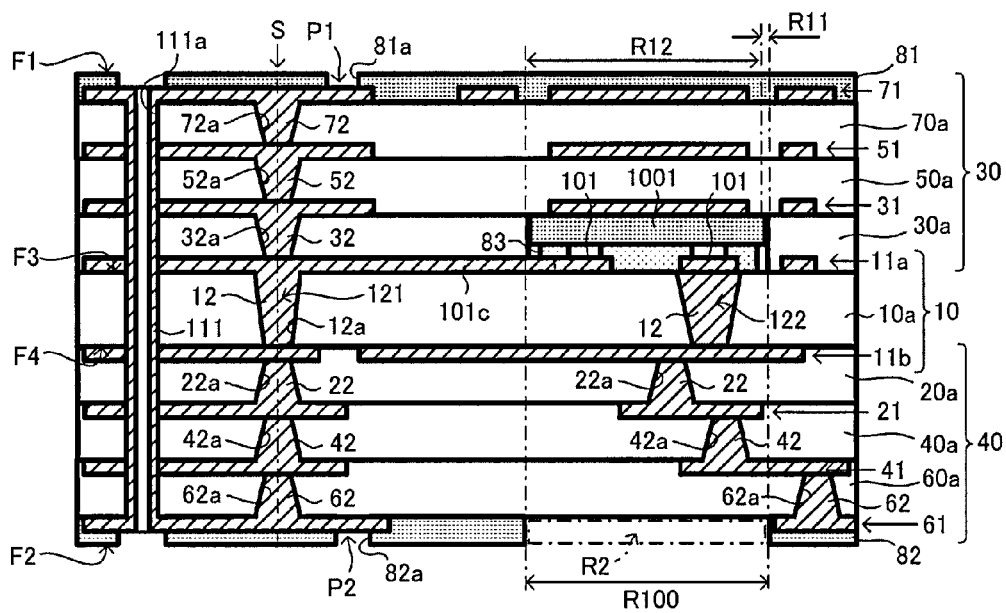
FIG. 17 is, regarding the manufacturing method shown in FIG. 10, a view to illustrate a step for forming an outer solder resist.

In step (S15) in FIG. 10, outer solder resists are formed. For example, as shown in FIG. 17, solder resist 81 having opening portion (81a) and solder resist 82 having opening portion (82a) are formed respectively on insulation layers (70a, 60a). Conductive layer 71 (in particular, a pad portion) is exposed through opening portion (81a), and conductive layer 61 (in particular, a pad portion) is exposed through opening portion (82a). At this stage, pads (P1, P2) do not have anticorrosion layers (P13, P23) (see FIG. 3).

Moreover, since solder resist 82 has opening portion (R2) in addition to opening portion (82a) for a pad, insulation layer (60a) is exposed through opening portion (R2). Opening portion (R2) is formed in region (R100) corresponding to cavity (R1) (see FIG. 20) as shown in FIG. 17 (see FIG. 2B).

Solder resist 81 having opening portion (81a) and solder resist 82 having opening portions (82a, R2) are each formed by screen printing, spray coating, roll coating, lamination or the like, for example. However, solder resists (81, 82) may be formed by any other method. For example, it is an option to conduct exposure and development to form opening portions (82a, R2) after forming solder resist without having opening portions.

In step (S16) in FIG. 10, a groove is formed by a laser.

Specifically, laser light is irradiated at groove portion (R11) from the upper-layer side of buildup section 30. As shown in FIG. 18A, for example, laser light is irradiated to draw a rectangle to cut out part of buildup section 30 from its surroundings. During that time, laser irradiation conditions (intensity or the like) are adjusted so that laser light reaches insulative substrate (10a) and groove (T1) is formed to have a predetermined depth. The irradiation angle of laser light is set substantially perpendicular to third surface (F3) of wiring board 10, for example.

When laser irradiating positions are changed, it is preferred to fix the object and move the laser (more strictly, laser sight), or alternatively, to fix the laser (more strictly, laser sight) and to move the object. When moving a laser, it is preferred to move a laser using a galvanometer mirror, for example.

Figure 18B:
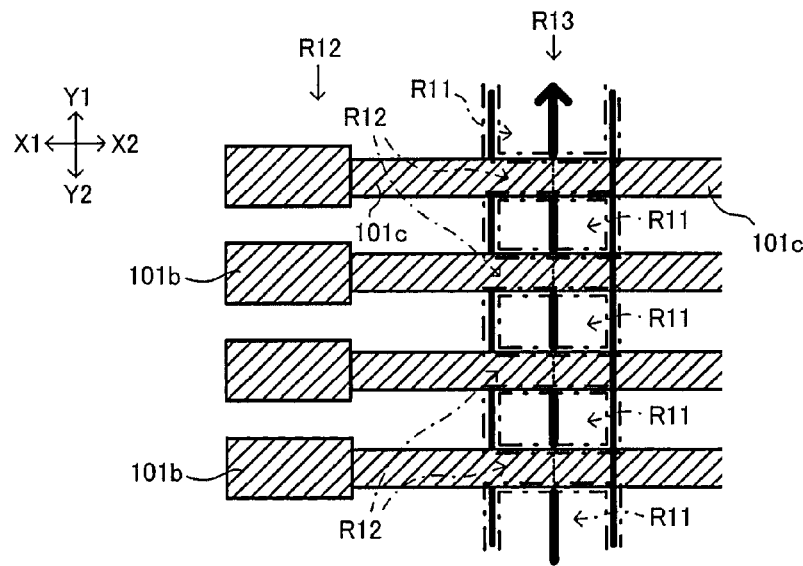
FIG. 18B is, regarding the manufacturing method shown in FIG. 10, a magnified view showing connected portions in the step to irradiate a laser.

In connecting portion (R13), a laser is irradiated so that multiple conductive patterns (101c) are each formed to cross groove (T1), and that part of groove (T1) and conductive pattern (101c) are alternately positioned as shown in FIG. 18B.

Here, as shown in FIG. 18B, groove (T1) is formed continuously except for connecting portion (R13), and is formed between conductive patterns (101c) made of metal (copper in the present embodiment) in connecting portion (R13). Since metal tends to reflect laser light, groove (T1) is formed by irradiating a laser without using a mask and without halting at connecting portion (R13) in the present embodiment. However, the laser intensity when intermittently forming groove (T1) at connecting portion (R13) is preferred to be set lower than the intensity when continuously forming groove (T1) (irradiating laser at portions except for connecting portion (R13)). By setting so, it is easier to reduce damage to conductive patterns (101c) by laser irradiation. When irradiating laser light at connecting portion (R13), it is preferred to frequently adjust laser intensity (power adjustment).

In the present embodiment, the above laser irradiation is performed maskless and without halting irradiation. However, that is not the only option. For example, laser light may be irradiated on the entire surface of the object using a shading mask where only the portions to be irradiated are open. Alternatively, it is also an option for only the required portions to be irradiated by laser light without using a shading mask, and by halting laser irradiation at portions not required to be irradiated.

In addition, laser intensity (the amount of light) is preferred to be adjusted by pulse control. Specifically, for example, to modify laser intensity, the number of shots (irradiation number) is changed without changing laser intensity per shot (one irradiation). Namely, if required laser intensity is not obtained with one shot, laser light will be irradiated again at the same irradiation spot. If such a control method is used, it is thought that the throughput will improve since time for modifying irradiation conditions is omitted. However, adjusting laser intensity is not limited to the above, and any other method may be taken. For example, irradiation conditions may be determined for each irradiation spot, while the irradiation number is set constant (for example, one shot per one irradiation spot).

Figure 19:
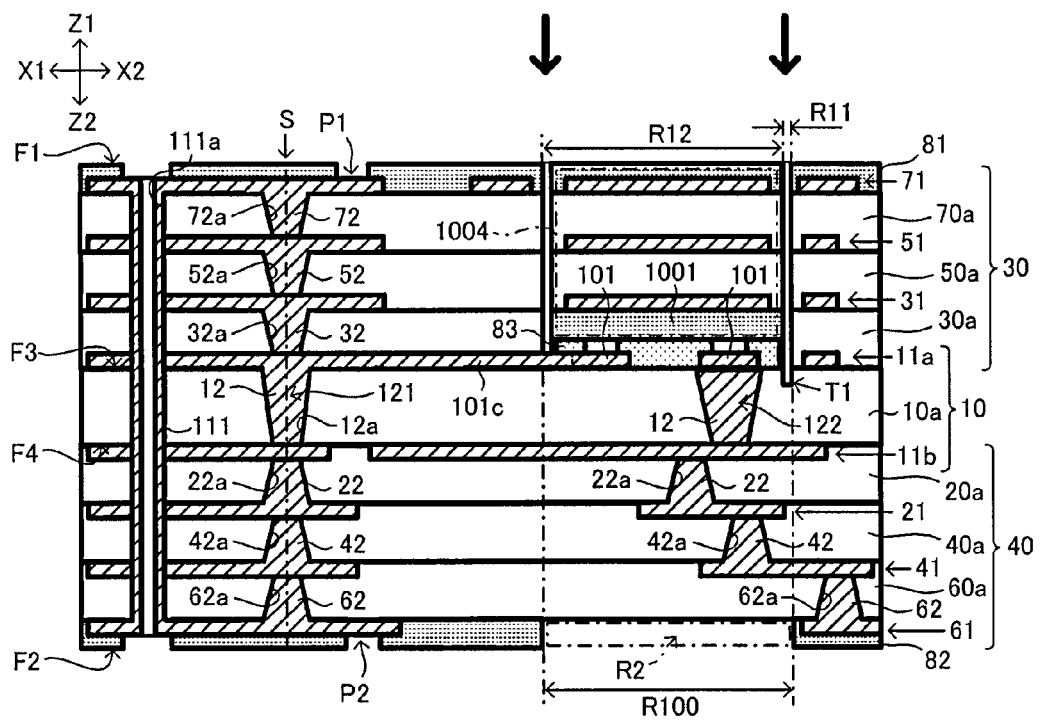
FIG. 19 is, regarding the manufacturing method shown in FIG. 10, a view showing grooves formed by laser irradiation.

By the above laser irradiation, part of buildup section 30 (mask 1001 and its upper portion) becomes removable while groove (T1) is formed on third surface (F3) of wiring board 10 (in particular, the main surface of insulative substrate (10a)) as shown in FIG. 19.

In the following the removable portion of buildup section 30 is referred to as cover portion 1004. In the present embodiment, a laser is used to cut buildup section 30 fairly easily. Thus, when buildup section 30 is thick, or buildup section 30 is multilayered, it is easier to form groove (T1).

Figure 20:
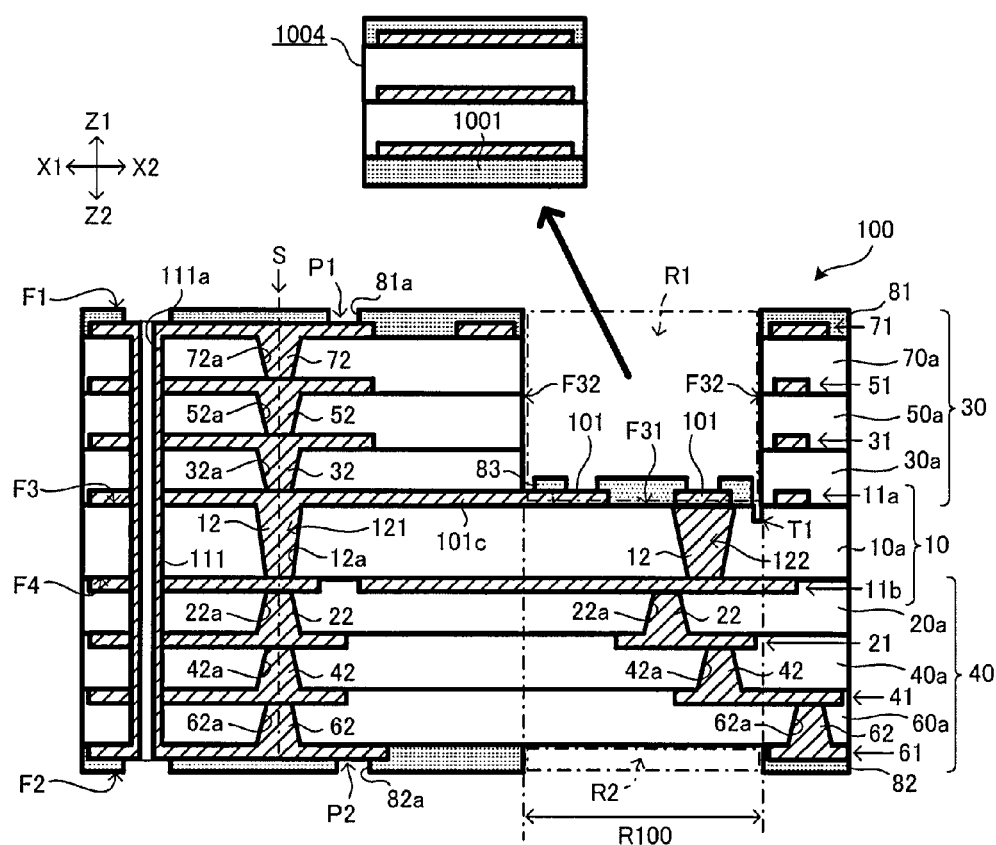
FIG. 20 is, regarding the manufacturing method shown in FIG. 10, a view to illustrate a step for forming a cavity.

In step (S17) in FIG. 10, force is added to remove cover portion 1004 from buildup section 30 (including mask 1001) manually or by other methods, for example, as shown in FIG. 20. Accordingly, when cavity (R1) is formed, a surface on insulative substrate (10a) where pads 101 and groove (T1) are formed (part of third surface (F3)) is set as bottom surface (F31). Also, groove (T1) is formed along wall surface (F32) of cavity (R1). In addition, pad 101 is positioned farther from wall surface (F32) than groove (T1) is.

In step (S18) in FIG. 10, anticorrosion layers (1013, P13, P23) (see FIG. 3) made of Ni/Au film, for example, are formed on exposed surfaces (pad surfaces or the like) by electrolytic plating, sputtering or the like. Alternatively, an OSP treatment may be performed to form anticorrosion layers (1013, P13, P23) made of organic preservative film. Accordingly, pad 101 with anticorrosion layer 1013 on its surface, and pads (P1, P2) with anticorrosion layers (P13, P23) on their respective surfaces are formed as shown in FIGS. 1 and 3. In addition, anticorrosion layer 1013 (see FIG. 3) is also formed on the surface of part of conductive pattern (101c) exposed in non-groove portion (R12) in connecting portion (R13) (see FIG. 18B).

Wiring board 100 (FIG. 1) is completed through the steps described above. The manufacturing method of the present embodiment is suitable for manufacturing wiring boards 100. Using such a manufacturing method, excellent wiring boards 100 are obtained at low cost.

Second Embodiment

A second embodiment of the present embodiment is described focusing on differences with the above first embodiment. Here, the same reference number is used for an element identical to the element shown in above FIG. 1 and other drawings, and a common portion already described, namely, the portion whose description would be redundant, is omitted or simplified here.

Figure 21:
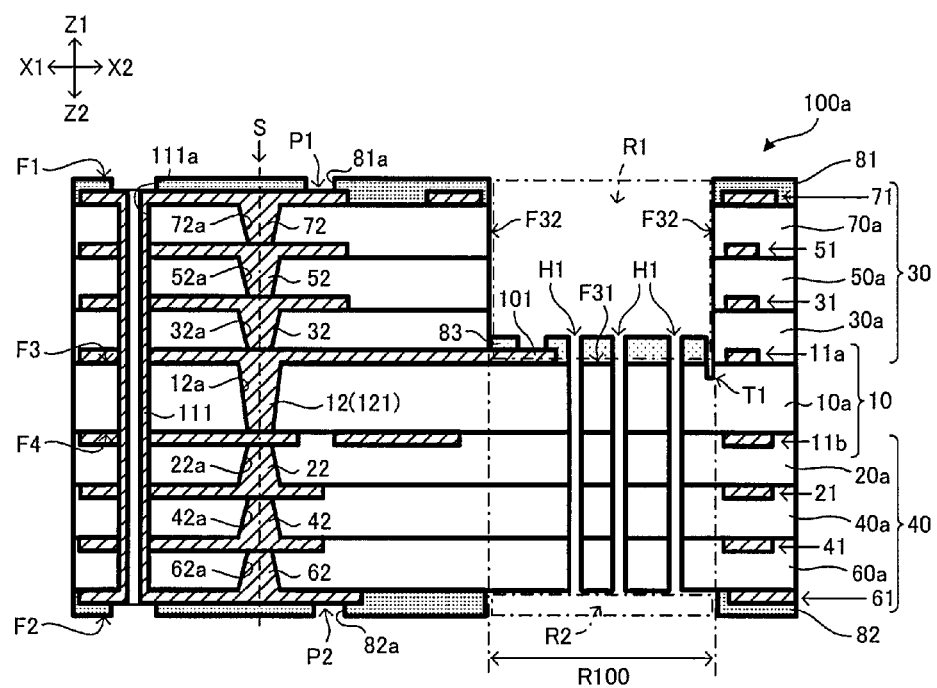
FIG. 21 is a cross-sectional view of a wiring board according to a second embodiment of the present invention.
Figure 22A:
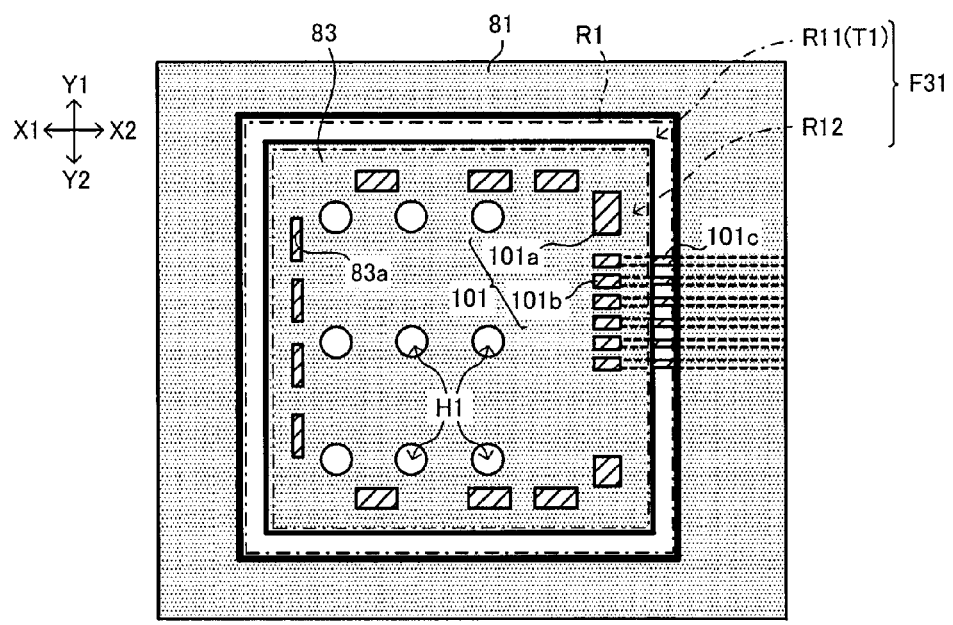
FIG. 22A is a plan view showing an outer layer on one side of a wiring board according to the second embodiment.
Figure 22B:
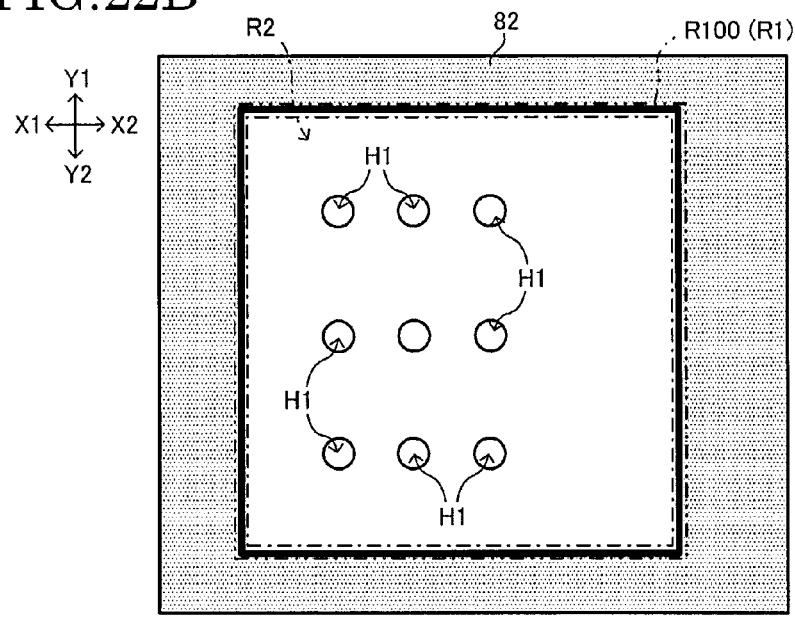
FIG. 22B is a plan view showing an outer layer on the other side of a wiring board according to the second embodiment.

FIGS. 21, 22A and 22B show outlines of wiring board (100a) of the present embodiment.

As shown in FIGS. 21 and 22A, wiring board (100a) has pad 101 for mounting an electronic device on bottom surface (F31) of cavity (R1) (recessed portion). In addition, as shown in FIGS. 21, 22A and 22B, through hole (H1) is formed on bottom surface (F31) of cavity (R1) penetrating through wiring board (100a). Through hole (H1) of the present embodiment is a non-plated through hole (NPTH) where no plating is formed on its wall surface. In the present embodiment, through hole (H1) penetrates through solder resist 83, wiring board 10 and buildup section 40. Namely, through hole (H1) penetrates from bottom surface (F31) of cavity (R1) (recessed portion) to second surface (F2). The shape of through hole (H1) is columnar, for example, and the diameter of through hole (H1) is 0.2 mm, for example.

As described above, through hole (H1) is formed on bottom surface (F31) of cavity (R1) in wiring board (100a) of the present embodiment. By doing so, warping is suppressed in wiring board (100a). Also, when warping is suppressed in wiring board (100a), electrical connection reliability is enhanced at pad 101 formed on bottom surface (F31) of cavity (R1). In the following, that situation is described with reference to FIG. 23 and other drawings.

Figure 24A:
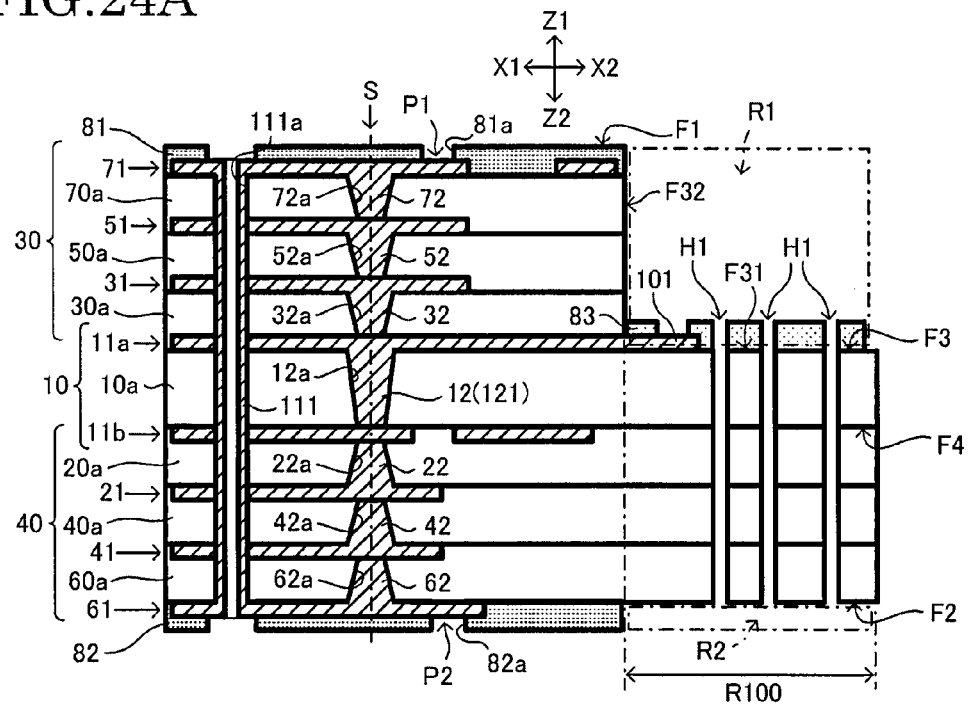
FIG. 24A is a cross-sectional view showing the structure of a first sample in the simulation of the second embodiment.
Figure 24B:
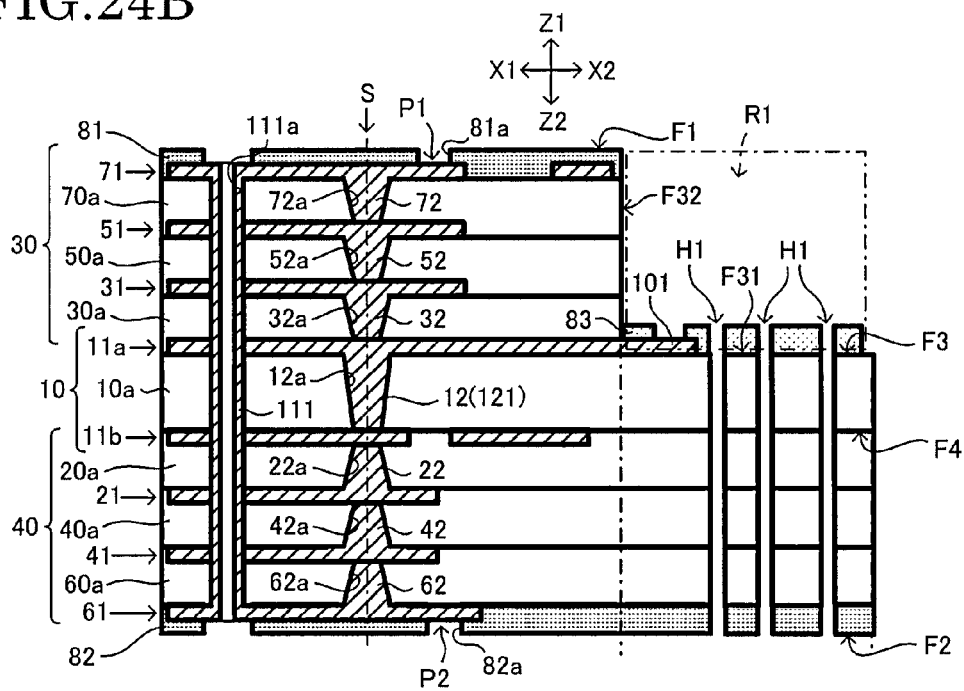
FIG. 24B is a cross-sectional view showing the structure of a second sample in the simulation of the second embodiment.

A simulation conducted by the inventor(s) is described below. Structures of samples (#21, #22) in the simulation are shown in FIGS. 23-24B. In FIGS. 24A and 24B, the same reference number is provided for the element shown in FIG. 21.

Samples (#21, #22) in the present simulation have the structures shown in FIG. 5, the same as samples (#11, #12) in the simulation conducted in the first embodiment. In addition, the dimensions of samples (#21, #22) are the same as those of samples (#11, #12) in the simulation conducted in the first embodiment. However, in samples (#21, #22), through hole (H1) (non-plated through hole) is formed in bottom surface (F31) of cavity (R1) as shown in FIG. 23. Then, in sample #21, solder resist 82 has opening portion (R2) in region (R100) corresponding to cavity (R1) (recessed portion), whereas solder resist 82 does not have such opening portion (R2) in sample #22. As shown in FIG. 24A, sample #21 has substantially the same structure as wiring board (100a) of the present embodiment shown in FIG. 21. As shown in FIG. 24B, sample #22 has the same structure as sample #21 except that solder resist 82 does not have opening portion (R2).

In the present simulation, a 3D linear static analysis was conducted on each of samples (#21, #22) using a commercially available software. Specifically, the amount of warping in each sample was measured when the thermal load was changed from 260° C. to 30° C.

Figure 25A:
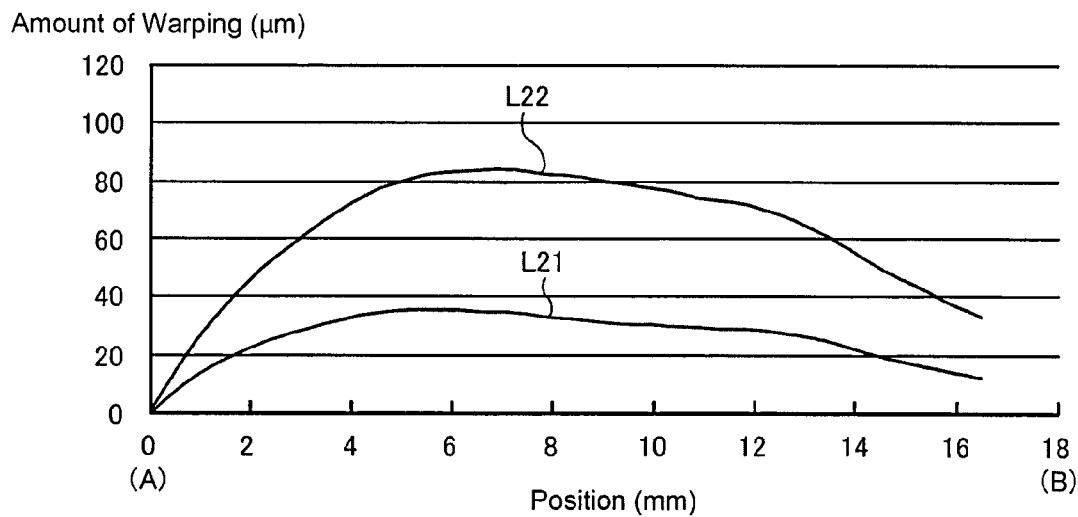
FIG. 25A is, regarding each sample in the simulation of the second embodiment, a graph showing simulation results of the amount of warping in the A-B direction in FIG. 5.
Figure 25B:
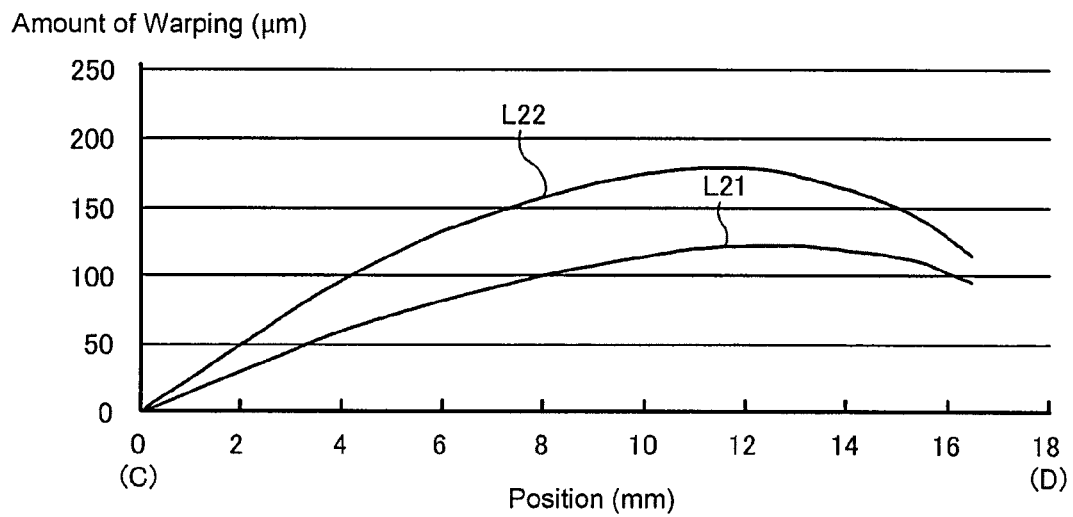
FIG. 25B is, regarding each sample in the simulation of the second embodiment, a graph showing simulation results of the amount of warping in the C-D direction in FIG. 5.

FIGS. 25A and 25B show simulation results of the amount of warping in samples (#21, #22). The amount of warping shown in FIG. 25A is the amount of warping in the A-B direction in FIG. 5, and the amount of warping shown in FIG. 25B is the amount of warping in the C-D direction in FIG. 5. In FIGS. 25A and 25B, line (L21) shows the data on sample (#21) and line (L22) shows the data on sample (#22).

Figure 26:
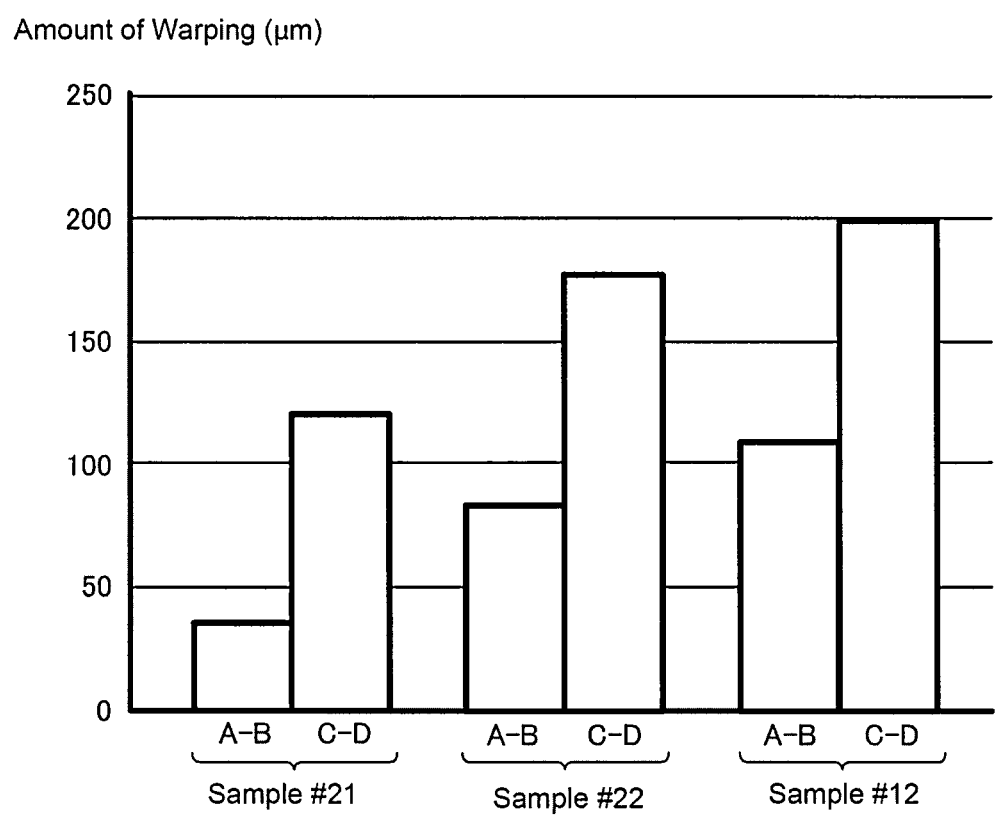
FIG. 26 is, regarding each sample in the simulations in the first and second embodiments, a graph showing the maximum amount of warping.

Also, FIG. 26 is a graph showing the maximum amount of warping in sample (#12) in the simulation conducted in the first embodiment (see FIGS. 6 and 9), and in samples (#21, #22) in the simulation conducted in the second embodiment.

As shown in FIGS. 25A, 25B and 26, the amount of warping is the smallest in sample (#21) (opening portion (R2): present, through hole (H1): present), next smallest in sample (#22) (opening portion (R2): not present, through hole (H1): present), and the greatest in sample #12 (opening portion (R2): not present, through hole (H1): not present). As found so, warping is suppressed in wiring board 100 by forming through hole (H1) on bottom surface (F31) of cavity (R1). Without being bound by a theory, the reason is thought to be that stress is released by through hole (H1).

In addition, opening portion (R2) and through hole (H1) in solder resist 82 may be used together. By combining those technologies, greater effects in suppressing warping are achieved than by using each technology individually.

In wiring board (100a) of the present embodiment, warping is suppressed in wiring board 100, thus enhancing electrical connection reliability at pad 101 formed on bottom surface (F31) of cavity (R1).

In the present embodiment, the thermal expansion coefficient of an interlayer insulation layer at a predetermined tier from insulative substrate (10a) (core substrate) in buildup section 40 (second laminated section) is set lower than the thermal expansion coefficient of the interlayer insulation layer at the predetermined tier from insulative substrate (10a) (core substrate) in buildup section 30 (first laminated section). More specifically, when compared at the same tiers, the thermal expansion coefficient of interlayer insulation layers in buildup section 40 is set lower than the thermal expansion coefficient of interlayer insulation layers in buildup section 30 in all the tiers. Namely, the thermal expansion coefficient of insulation layer (20a)<the thermal expansion coefficient of insulation layer (30a); the thermal expansion coefficient of insulation layer (40a)<the thermal expansion coefficient of insulation layer (50a); and the thermal expansion coefficient of insulation layer (60a)<the thermal expansion coefficient of insulation layer (70a). Accordingly, warping is suppressed in wiring board (100a) in heat cycles. If the thermal expansion coefficient of an insulation layer in buildup section 40 is lower than the thermal expansion coefficient of an insulation layer in buildup section 30 in at least one tier, effects are achieved to a certain degree.

Figure 27:
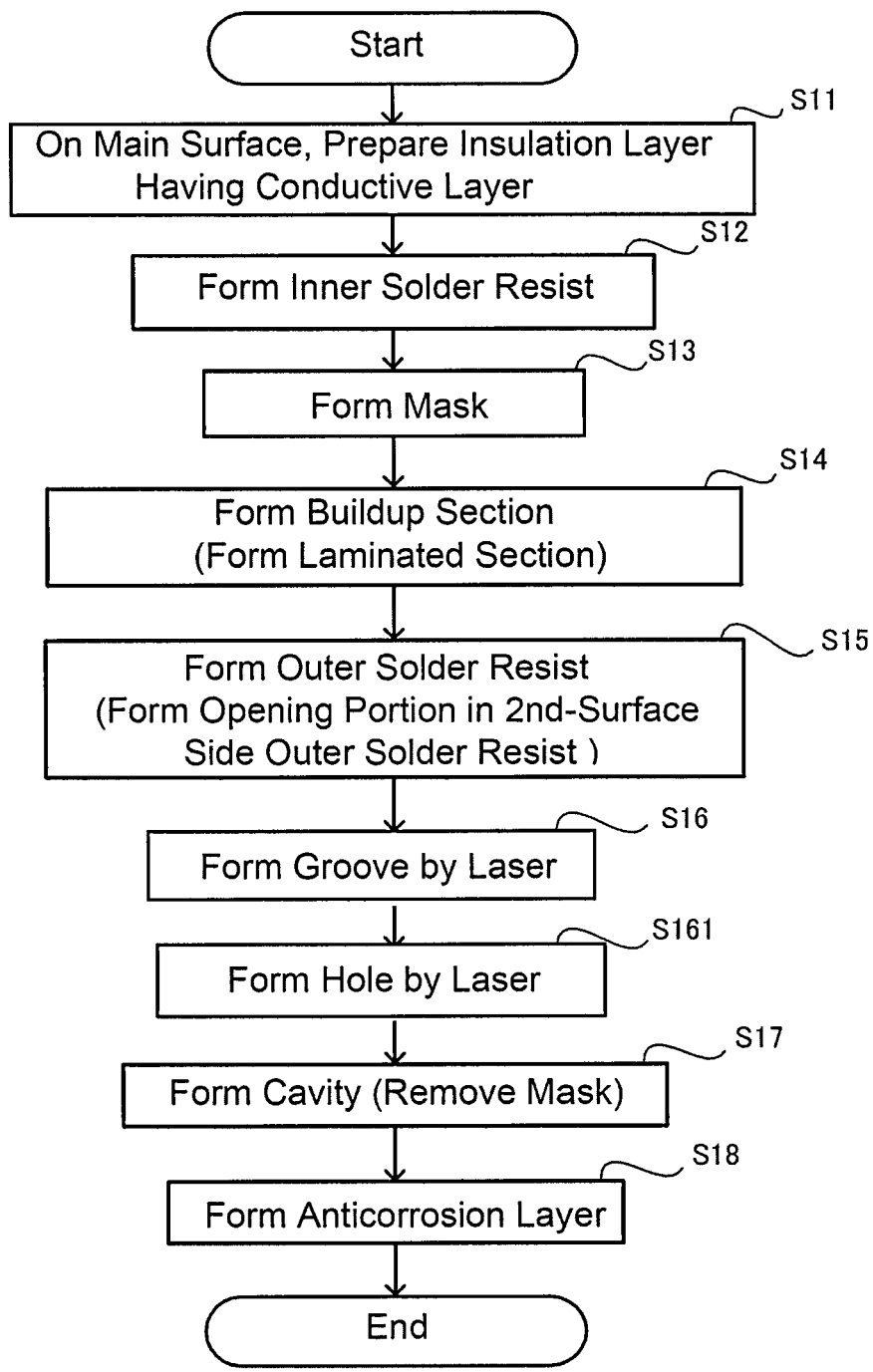
FIG. 27 is a flowchart showing a method for manufacturing a wiring board according to the second embodiment of the present invention.

Wiring board (100a) according to the present embodiment is manufactured in the process shown in FIG. 27, for example.

Figure 28:
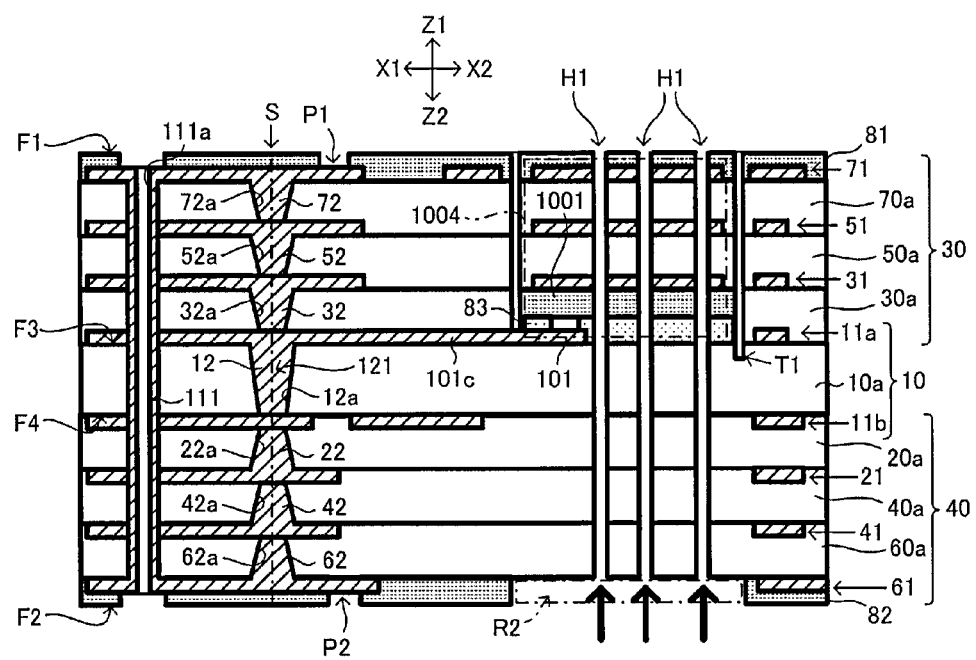
FIG. 28 is, in the manufacturing method shown in FIG. 27, a view to illustrate a step for forming a non-plated through hole.

Specifically, after groove (T1) is formed the same as in steps (S11)~(S16) in FIG. 10, through hole (H1) (non-plated through hole) is formed in step (S161) in FIG. 27. Through hole (H1) is formed by using a laser to make a hole from the second-surface (F2) side toward the first-surface (F1) side as shown in FIG. 28, for example. However, that is not the only option, and a drill or the like may be used to form through hole (H1). Using a drill, it is easier to cut insulative substrate (10a) or the like even if insulative substrate (10a) or the like contains core material (such as glass cloth).

In steps (S17) and (S18) in FIG. 27, cavity (R1) and anti-corrosion layers (1013, P13, P23) (see FIG. 3) are formed the same as in steps (S17) and (S18) in FIG. 10. As a result, wiring board (100a) is completed (FIG. 21).

Other Embodiments

Figure 29A:
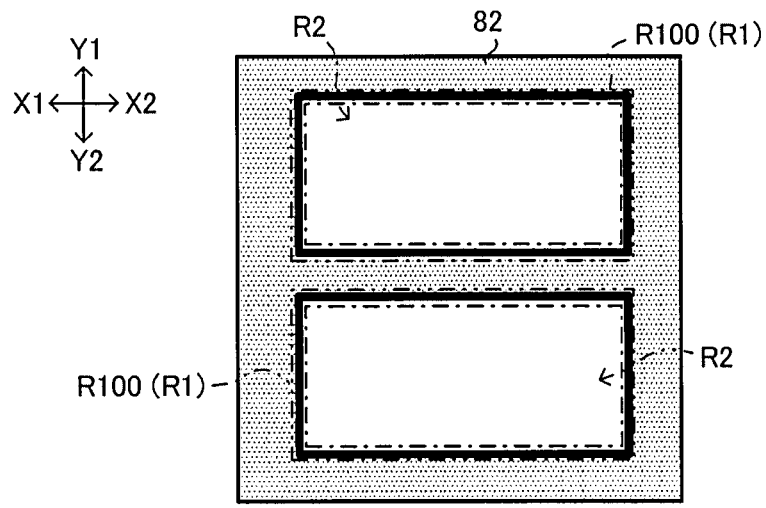
FIG. 29A is, in another embodiment of the present invention, a view showing a first example of a wiring board having multiple cavities.
Figure 29B:
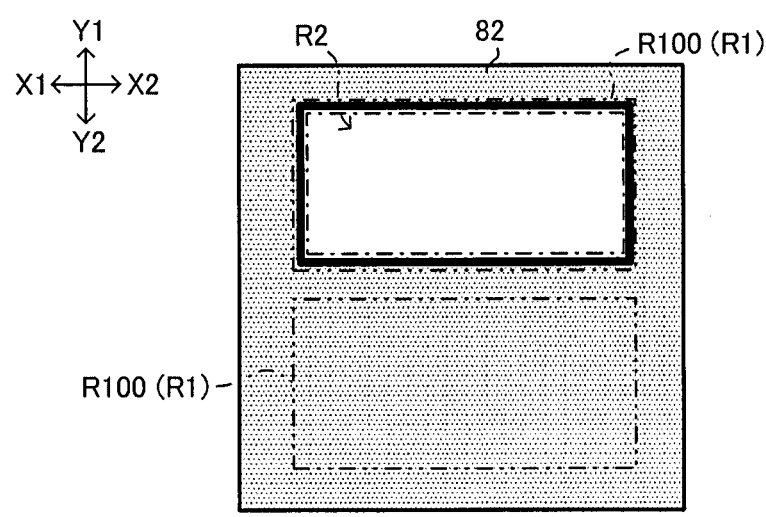
FIG. 29B is, in yet another embodiment of the present invention, a view showing a second example of a wiring board having multiple cavities.

Only one cavity (R1) (recessed portion) is formed in wiring board 100 of the above first embodiment. However, that is not the only option, and multiple cavities (R1) (recessed portions) (two, for example) may be formed in a wiring board as shown in FIGS. 29A and 29B. Opening portion (R2) (second opening portion) may be formed on the back faces of all cavities (R1) as shown in FIG. 29A. Alternatively, not all cavities (R1) are required to have a second opening portion (R2) on their back faces as shown in FIG. 29B. However, to achieve the effect of suppressing warping on the entire substrate surface, it is preferred that opening portion (R2) be formed on the back faces of all the cavities (R1).

Figure 30A:
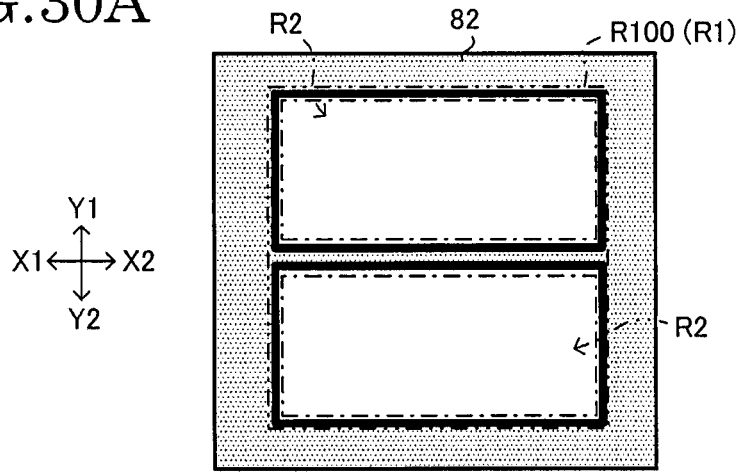
FIG. 30A is, in yet another embodiment of the present invention, a view showing a first alternative example of the shape of opening portions in the second-surface side solder resist formed in a region corresponding to the first-surface side cavity.
Figure 30B:
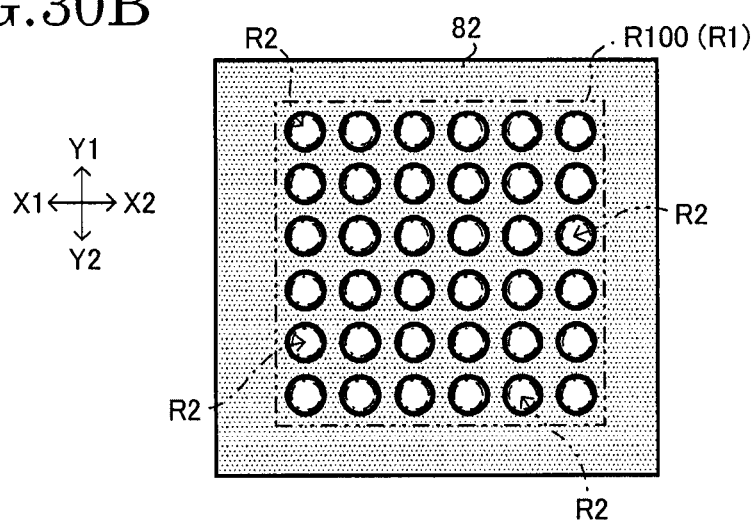
FIG. 30B is, in yet another embodiment of the present invention, a view showing a second alternative example of the shape of opening portions in the second-surface side solder resist formed in a region corresponding to the first-surface side cavity.
Figure 30C:
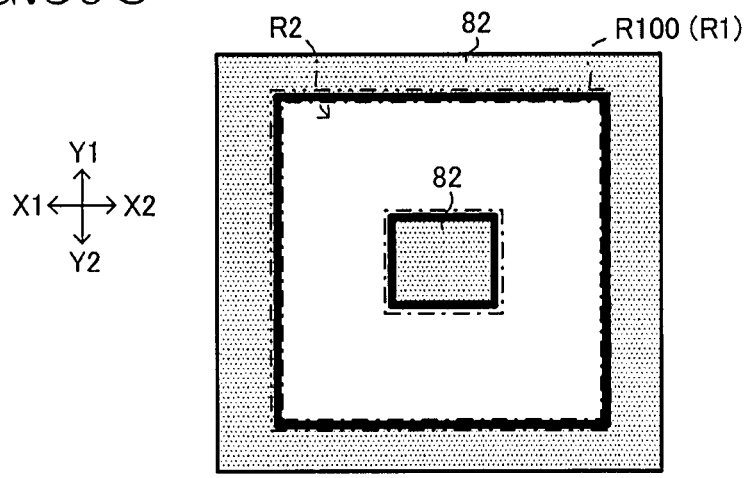
FIG. 30C is, in yet another embodiment of the present invention, a view showing a third alternative example of the shape of an opening portion in the second-surface side solder resist formed in a region corresponding to the first-surface side cavity.

In the first embodiment above, a single opening portion (R2) (second opening portion) formed on the back face of cavity (R1) (recessed portion) in solder resist 82 (second-surface side solder resist) is formed in region (R100) corresponding to cavity (R1) (recessed portion) on the first-surface (F1) side. However, that is not the only option. For example, as shown in FIG. 30A or 30B, multiple opening portions (R2) may be positioned in substantially the entire region (R100) corresponding to cavity (R1) on the first-surface (F1) side. Alternatively, as shown in FIG. 30C, for example, solder resist 82 may remain partially in region (R100). As long as opening portion (R2) of solder resist 82 is formed in region (R100) corresponding to cavity (R1) on the first-surface (F1) side, warping is suppressed in wiring board 100, and electrical connection reliability is enhanced at pad 101 formed on bottom surface (F31) of cavity (R1).

Figure 31A:
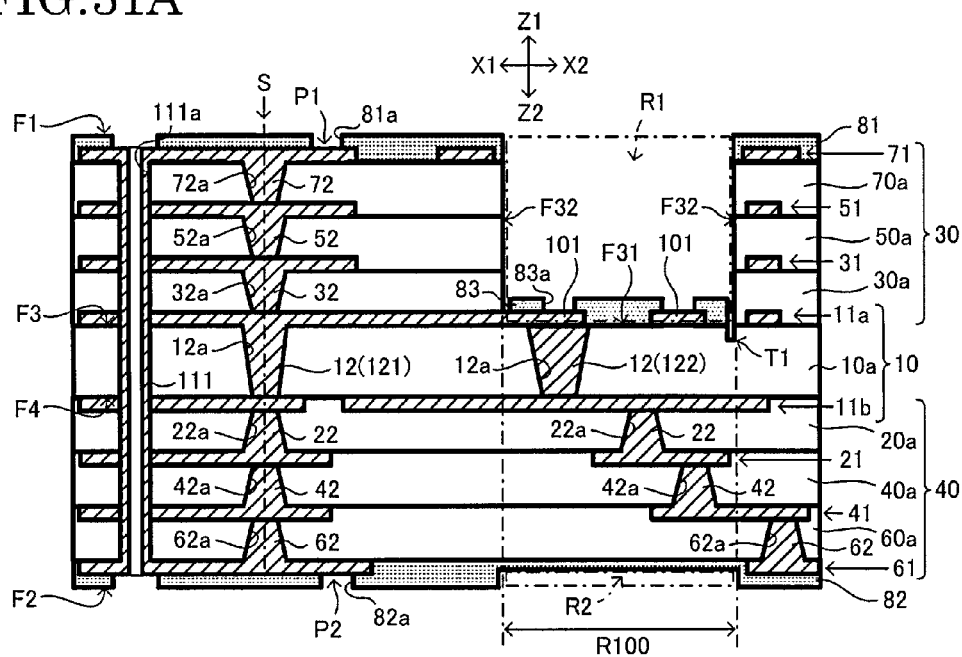
FIG. 31A is, in yet another embodiment of the present invention, a view showing an example where the depth of an opening portion in the second-surface side solder resist is less than the thickness of the solder resist.
Figure 31B:
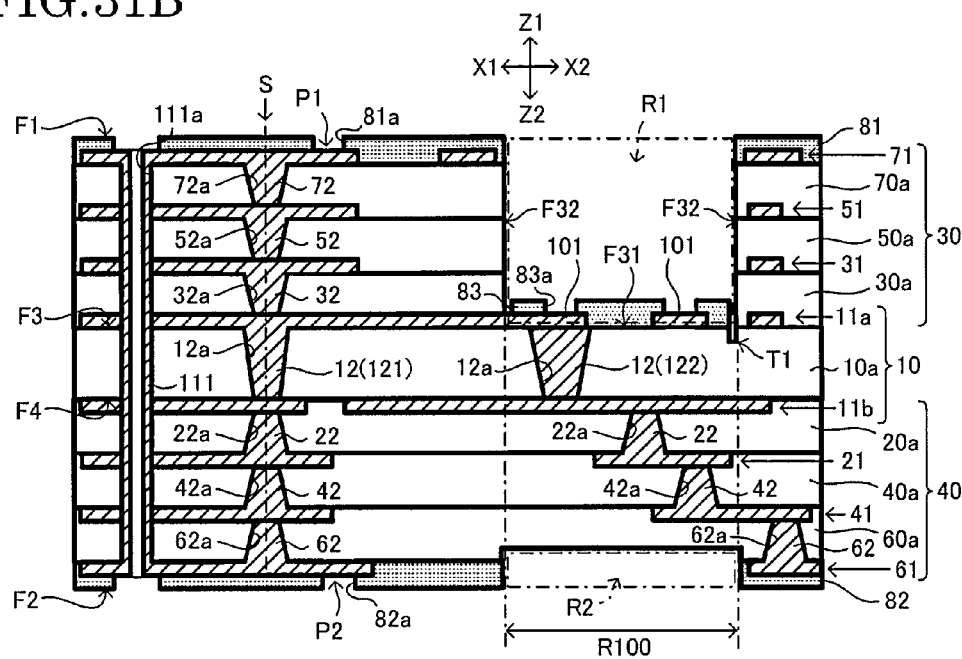
FIG. 31B is, in yet another embodiment of the present invention, a view showing an example where the depth of an opening portion in the second-surface side solder resist is greater than the thickness of the solder resist.

In the first embodiment above, the depth of opening portion (R2) is set equal to the thickness of solder resist 82. However, the depth of opening portion (R2) of solder resist 82 is not limited to such, and it may be less than the thickness of solder resist 82 as shown in FIG. 31A, for example. Such opening portion (R2) may be formed by blasting or etching, for example. Alternatively, the depth of opening portion (R2) of solder resist 82 may be greater than the thickness of solder resist 82 as shown in FIG. 31B, for example. Such opening portion (R2) may be formed by laser processing or etching, for example.

Figure 32:
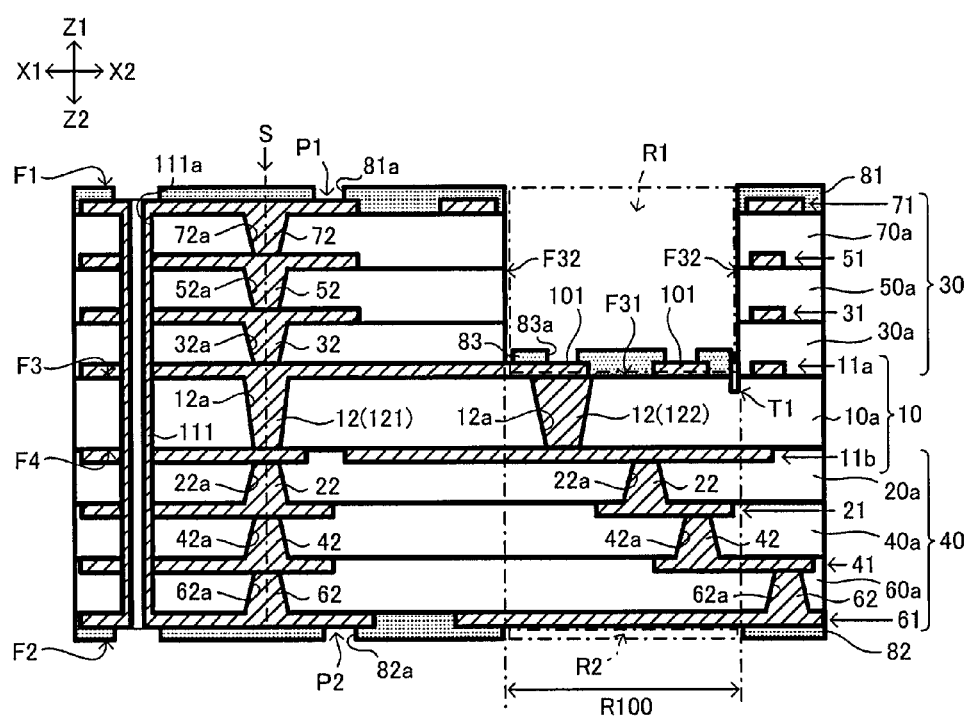
FIG. 32 is in yet another embodiment of the present invention, a cross-sectional view showing an example where the outermost conductive layer is exposed through an opening portion in the second-surface side solder resist.
Figure 33A:
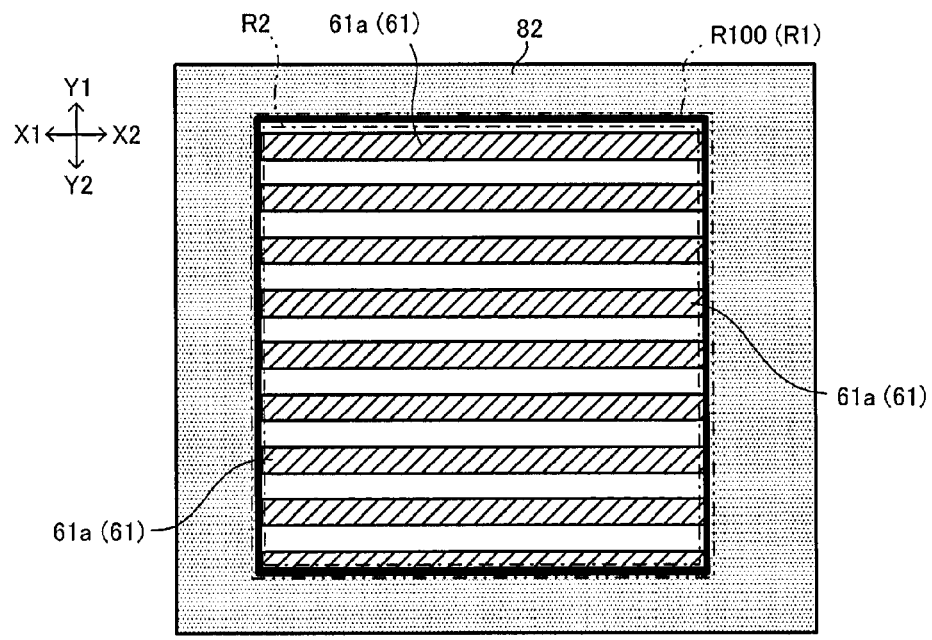
FIG. 33A is, in yet another embodiment of the present invention, a plan view showing an example where wiring of the outermost conductive layer is exposed through an opening portion in the second-surface side solder resist.
Figure 33B:
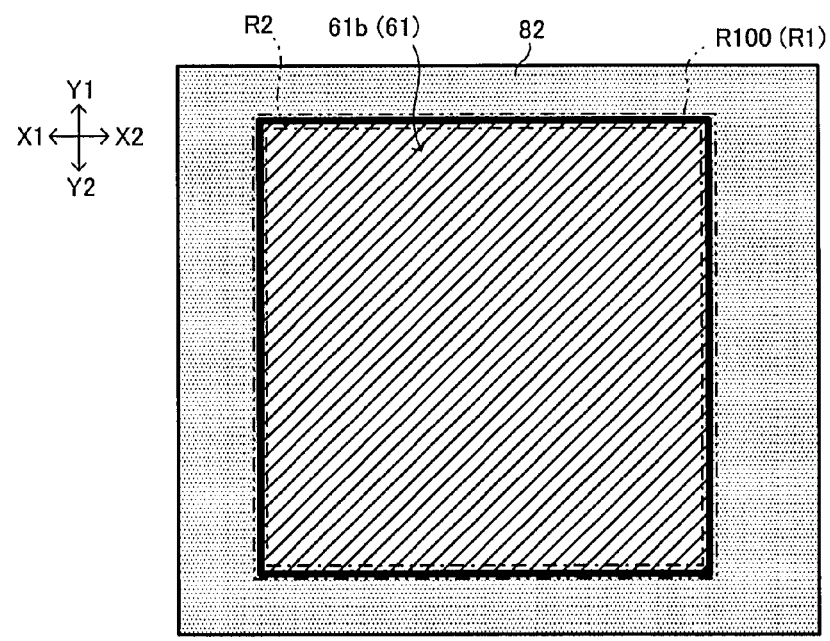
FIG. 33B is, in yet another embodiment of the present invention, a plan view showing an example where a planar conductive pattern of the outermost conductive layer is exposed through an opening portion in the second-surface side solder resist.

The first embodiment above showed an example where insulation layer (60a) is exposed through opening portion (R2) (second opening portion). However, that is not the only option, and conductive layer 61 (outermost conductive layer) may be exposed through opening portion (R2) as shown in FIG. 32, for example. Specifically, as shown in FIG. 33A, for example, wiring (61a) of conductive layer 61 may be positioned in opening portion (R2) (region R100). Alternatively, planar conductive pattern (61b) of conductive layer 61 may be positioned in substantially the entire opening portion (R2) (region R100) as shown in FIG. 33B, for example. By positioning a conductive pattern (especially a metallic pattern) in opening portion (R2) (region R100), effects such as enhancing strength or shielding electromagnetic waves are achieved. Also, if electromagnetic waves are prevented from entering through opening portion (R2), it is thought that noise is reduced in an electronic component mounted in cavity (R1). Effects such as enhancing strength and shielding electromagnetic waves are especially great when a planar conductive pattern is arranged in opening portion (R2).

Figure 34A:
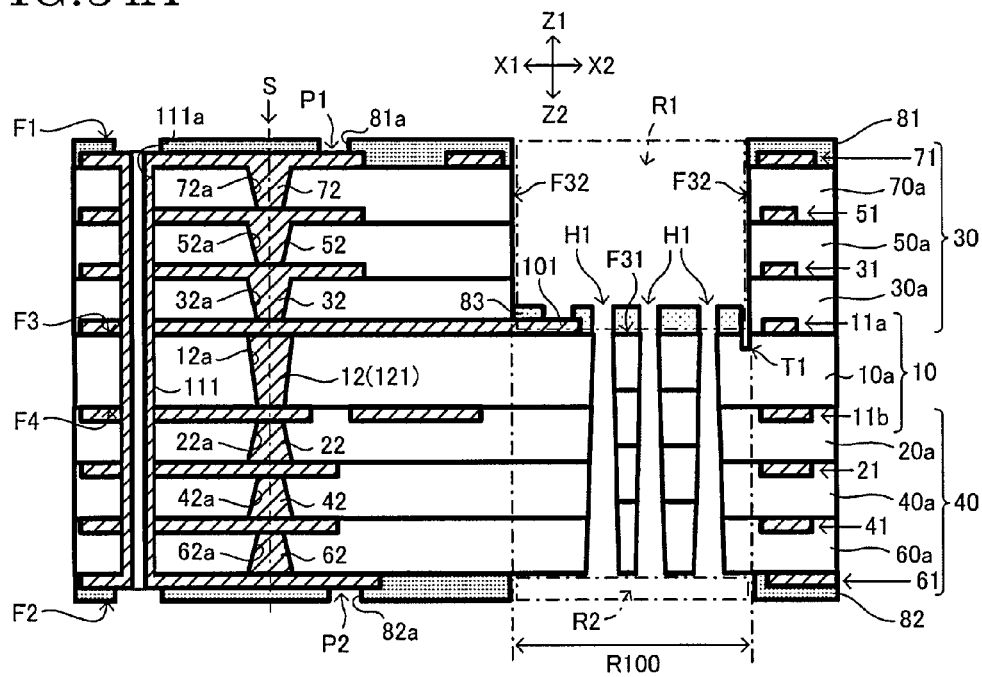
FIG. 34A is, in yet another embodiment of the present invention, a view showing an example where a non-plated through hole tapers from one side to the other side.

In the second embodiment above, columnar through hole (H1) was shown. However, the shape of through hole (H1) may be determined freely. As shown in FIG. 34A, for example, through hole (H1) may taper to be narrower from the second-surface (F2) side toward the first-surface (F1) side. In such a structure, it is easier to remove a mask or the like by inserting a pin to push from an opening on the second-surface (F2) side.

Figure 34B:
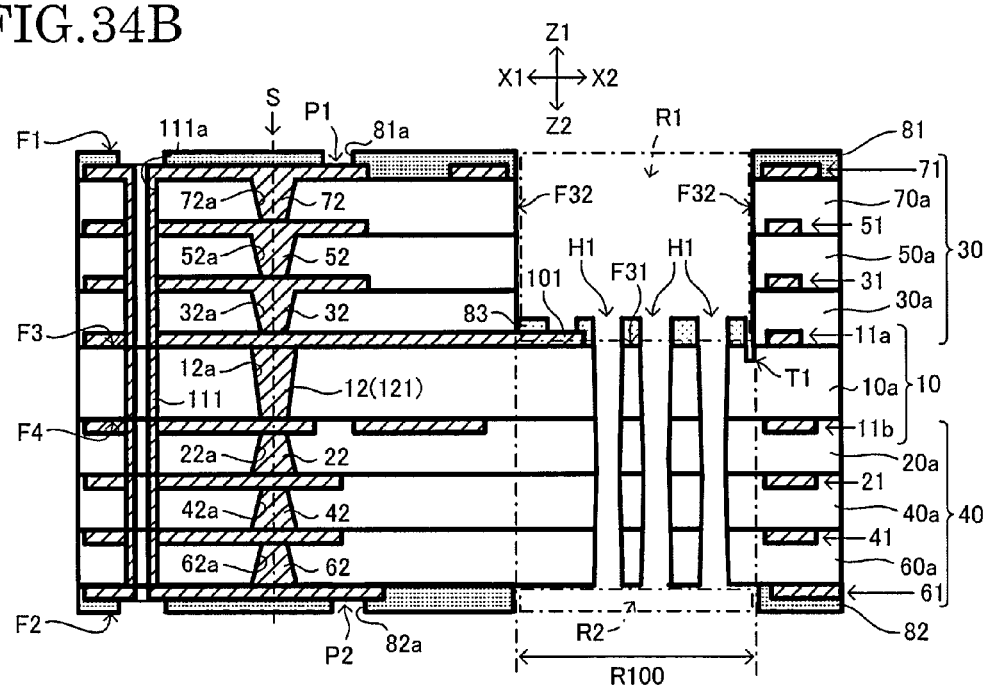
FIG. 34B is, in yet another embodiment of the present invention, a view showing an example where a non-plated through hole tapers from both of its ends toward the inside.

Alternatively, through hole (H1) may taper to be narrower from the first-surface (F1) side toward the second-surface (F2) side. Yet alternatively, through hole (H1) may taper toward the inside from the first-surface (F1) side and the second-surface (F2) side respectively, as shown in FIG. 34B.

Figure 35:
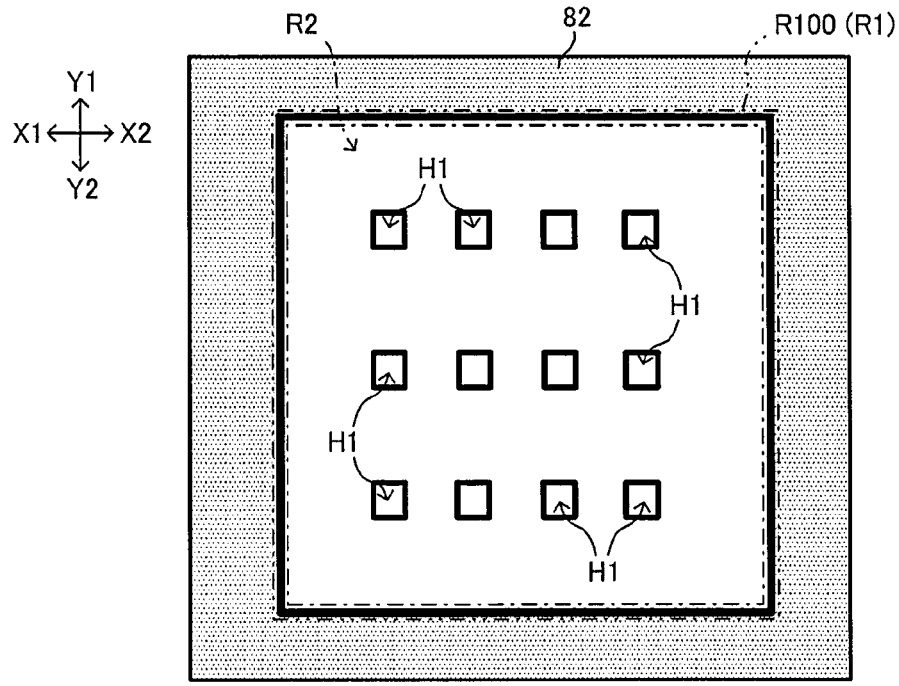
FIG. 35 is in yet another embodiment of the present invention, a view showing an example where the opening shape of a non-plated through hole is rectangular.

The opening shape of through hole (H1) may also be determined freely. For example, as shown in FIG. 35, it may be a polygon (such as a rectangle).

Figure 36:
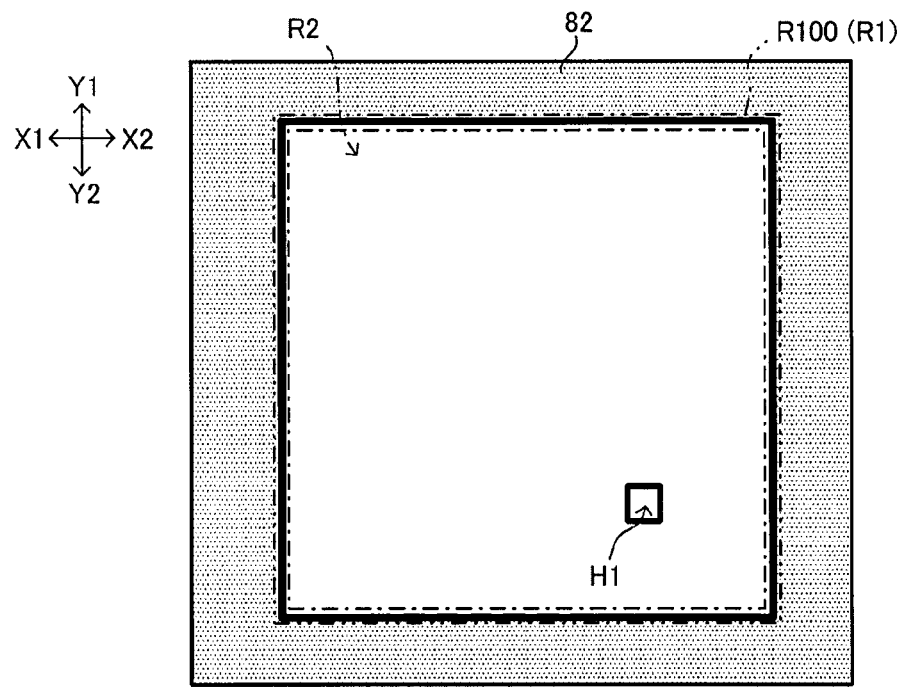
FIG. 36 is, in yet another embodiment of the present invention, a view showing an example where the number of non-plated through holes is one.

The number of through holes (H1) may also be determined freely. For example, as shown in FIG. 36, it may be one.

The shape and number of grooves (T1) may be determined freely. For example, the cross-sectional shape (X-Z plane, or Y-Z plane) of groove (T1) may be substantially trapezoidal, substantially V-shaped, or substantially W-shaped.

Figure 37:
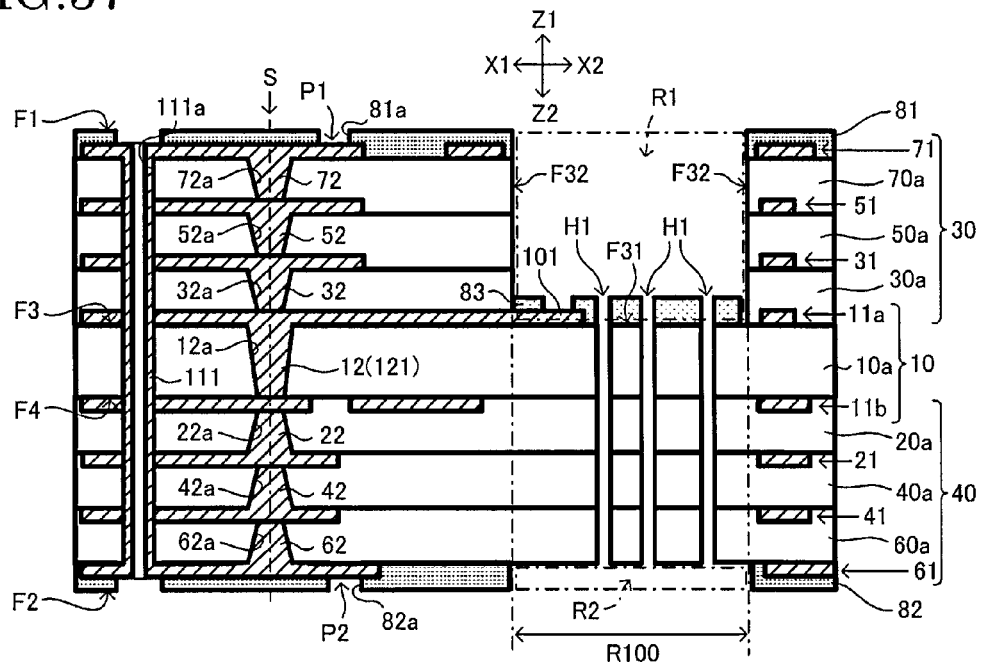
FIG. 37 is, in yet another embodiment of the present invention, a view showing an example where no groove is formed on the bottom of a cavity that opens on one side.

Also, groove (T1) is not always required to be formed. For example, as shown in FIG. 37, it is an option not to form groove (T1) on bottom surface (F31) of cavity (R1).

Figure 38:
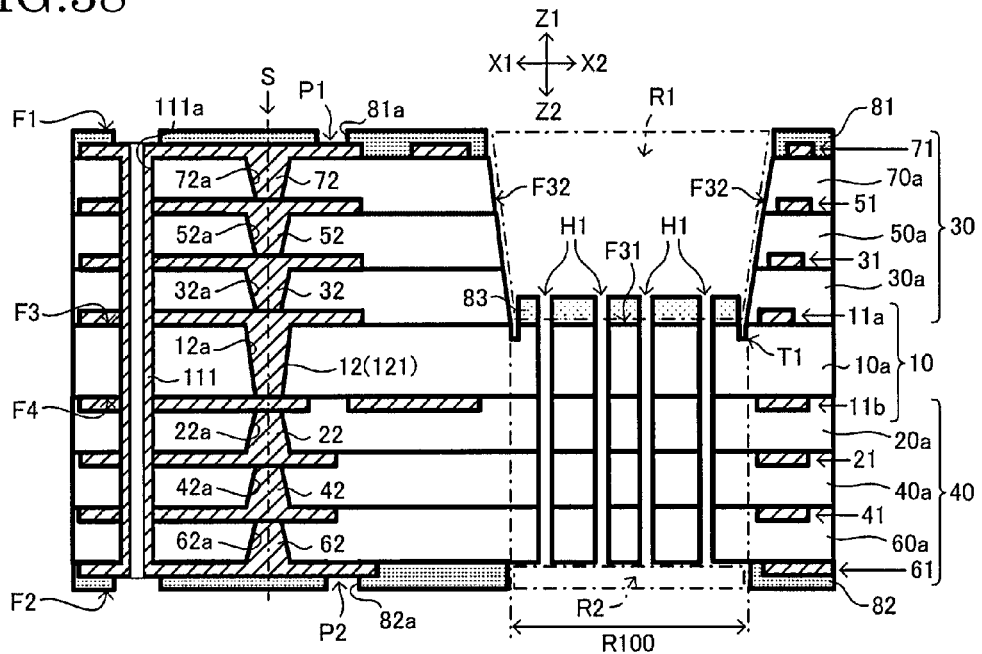
FIG. 38 is, in yet another embodiment of the present invention, a view showing an example where a wall surface tapers in a cavity that opens on one side.
Figure 39A:
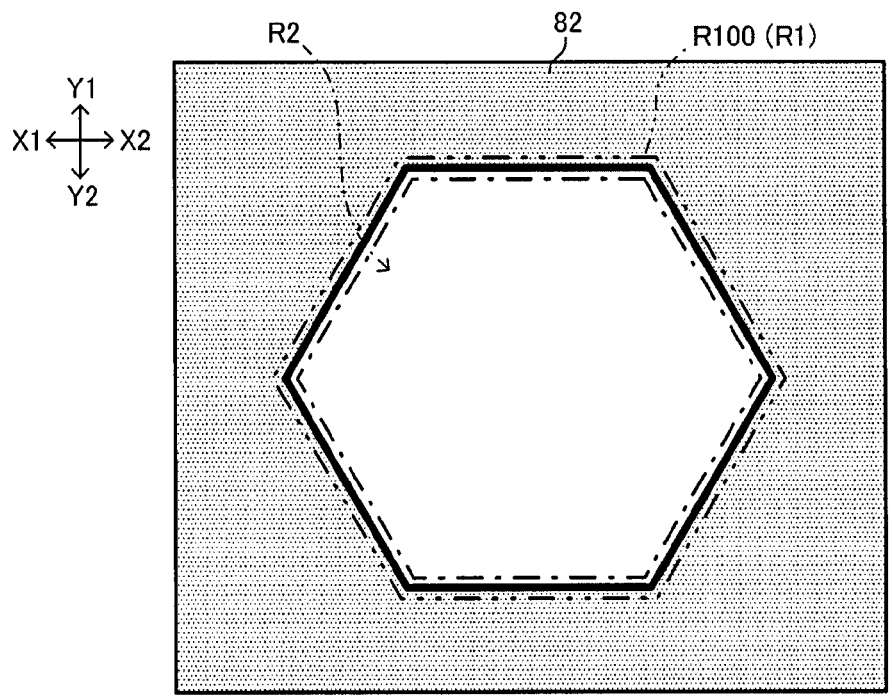
FIG. 39A is, in yet another embodiment of the present invention, a view showing an example where the opening shape of a cavity that opens on one side is hexagonal.
Figure 39B:
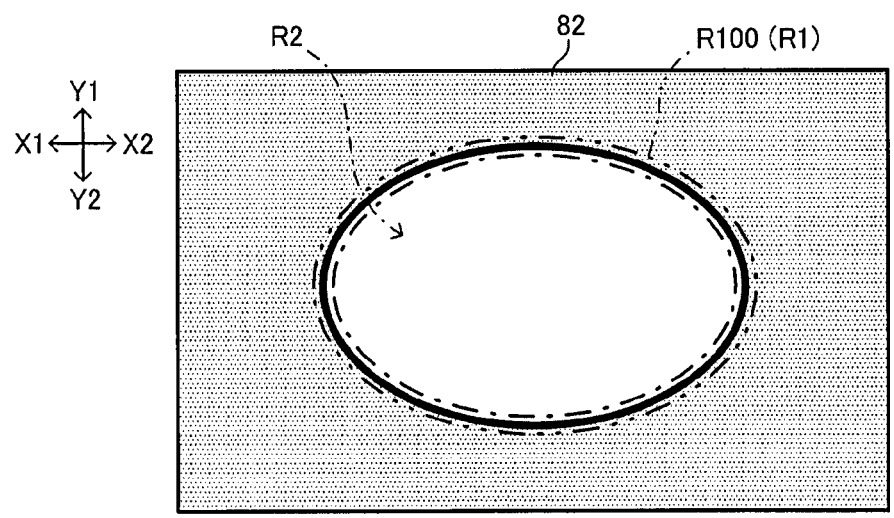
FIG. 39B is, in yet another embodiment of the present invention, a view showing an example where the opening shape of a cavity that opens on one side is elliptic.

In each embodiment above, rectangular cavity (R1) (recessed portion) was shown. However, the shape of cavity (R1) may be determined freely. For example, as shown in FIG. 38, the wall surface of cavity (R1) may taper to be narrower from the first-surface (F1) side toward the second-surface (F2) side. The opening shape of cavity (R1) may also be determined freely. For example, as shown in FIG. 39A, it may be a polygon other than a rectangle (a hexagon, for example). Alternatively, as shown in FIG. 39B, for example, it may be a circle (an ellipse, for example). In such a case as well, as long as opening portion (R2) of solder resist 82 is formed in region (R100) corresponding to cavity (R1) on the first-surface (F1) side, warping is suppressed in wiring board 100, and electrical connection reliability is enhanced at pad 101 formed on bottom surface (F31) of cavity (R1).

Figure 40A:
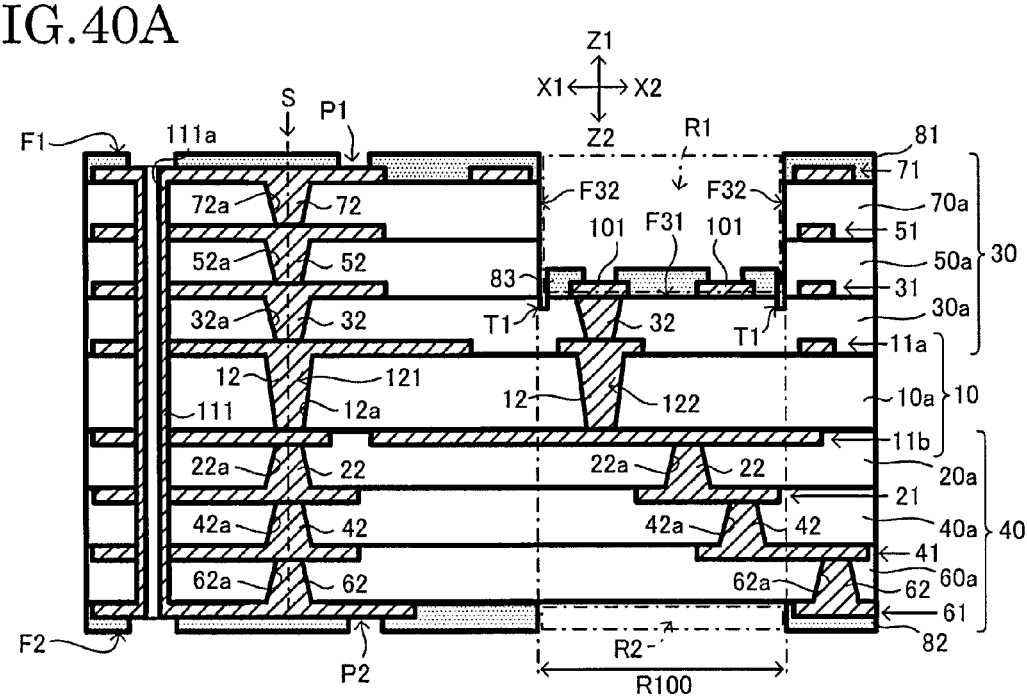
FIG. 40A is, in the embodiments of the present invention, a view showing a first alternative example where a cavity that opens on one side has a different depth.
Figure 40B:
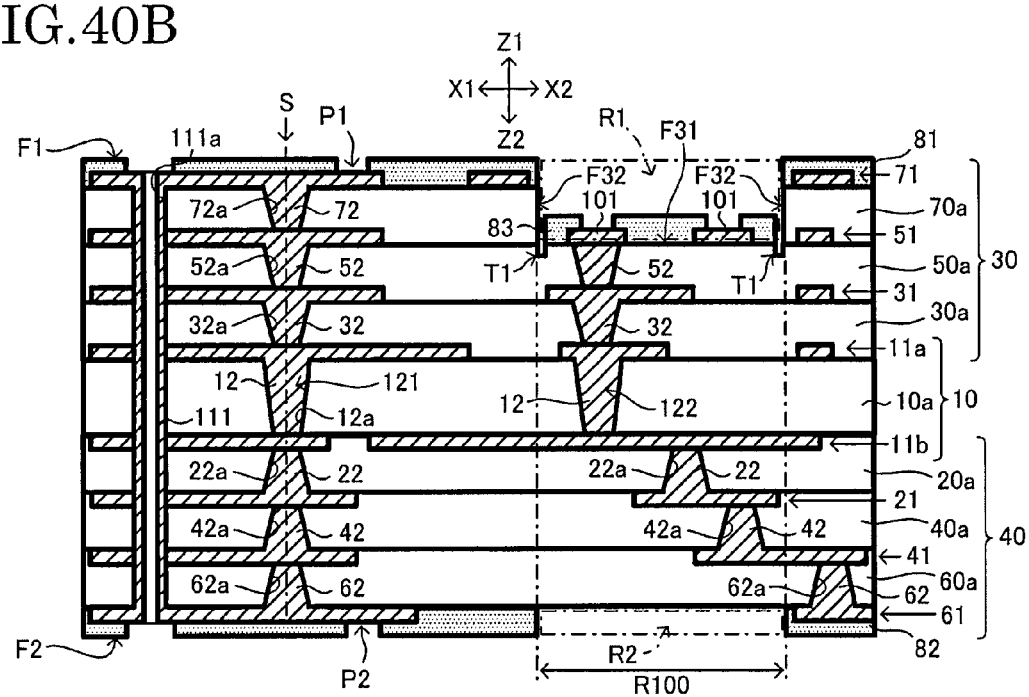
FIG. 40B is, in the embodiments of the present invention, a view showing a second alternative example where a cavity that opens on one side has yet a different depth.

In each embodiment above, cavity (R1) penetrates through buildup section 30. However, that is not the only option, and cavity (R1) may be an opening portion that does not penetrate through buildup section 30. For example, bottom surface (F31) of cavity (R1) may correspond to a main surface of insulation layer (30a) as shown in FIG. 40A, or bottom surface (F31) of cavity (R1) may correspond to a main surface of insulation layer (50a) as shown in FIG. 40B, for example.

Figure 41:
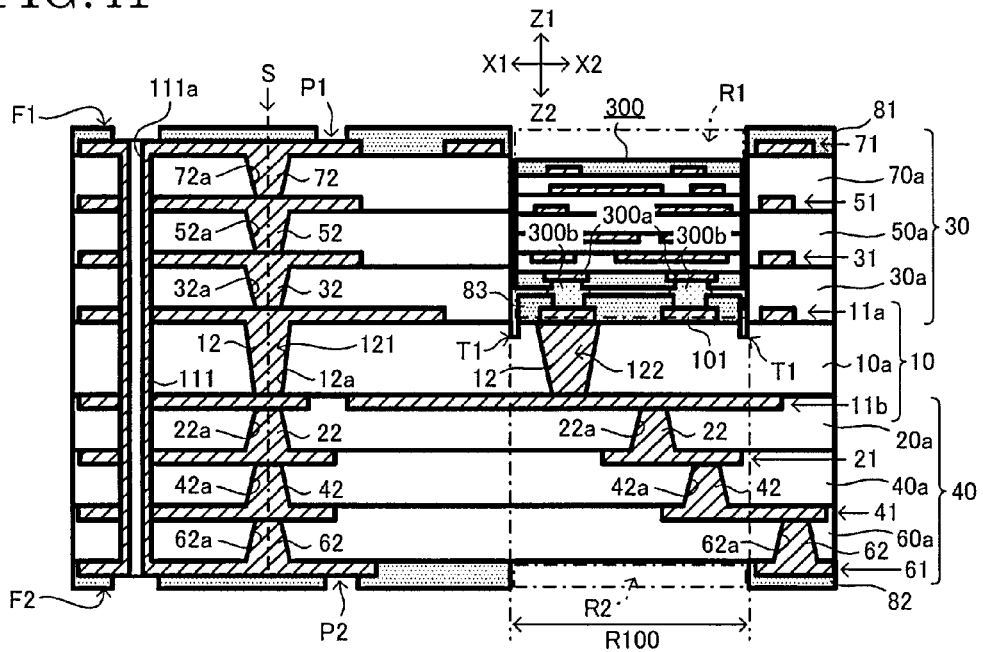
FIG. 41 is, in the embodiments of the present invention, a view showing an alternative example where another wiring board is mounted instead of an electronic component.

It does not have to be electronic component 200 (FIG. 4A) that is electrically connected to pad 101. For example, it may be another wiring board 300 as shown in FIG. 41. In the example in FIG. 41, wiring board 300 is accommodated in cavity (R1), and external connection terminal (300a) of wiring board 300 is electrically connected to pad 101 through solder (300b). In wiring board 300, it is preferred that each conductive layer have a finer conductive pattern, or the interlayer insulation layer between conductive layers be made thinner, for example, so that the density of conductors is higher than that in wiring board 100.

The method for mounting electronic component 200 or the like to be accommodated in cavity (R1) is not limited to soldering. For example, other methods such as wire bonding, ACF (anisotropic conductive film) connection, insertion or the like may also be used.

Regarding other factors, the structure of wiring board 100, as well as type, performance, measurements, quality, shapes, number of layers, positioning and so forth of the elements of such a structure, may be modified freely within a scope that does not deviate from the gist of the present invention.

Figure 42:
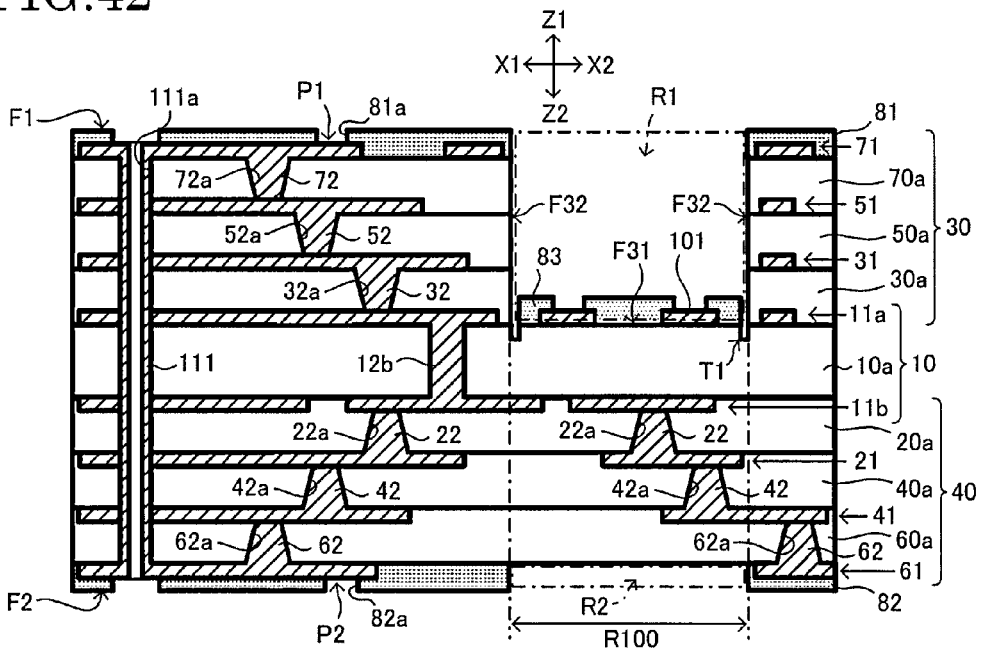
FIG. 42 is, in yet another embodiment of the present invention, a view showing a wiring board where the terminal pitch of pads formed on the bottom of a cavity that opens on one side fans out toward outer layers.

For example, it may be a wiring board without filled-stack structure (S) as shown in FIG. 42. Via conductors (22, 32, 42, 52, 62, 72) are positioned to fan out toward the outer layer by increasing the terminal pitch of pads 101 in the example in FIG. 42.

Alternatively, through-hole conductor (12b) may be used instead of via conductor 12 as shown in FIG. 42.

Figure 43:
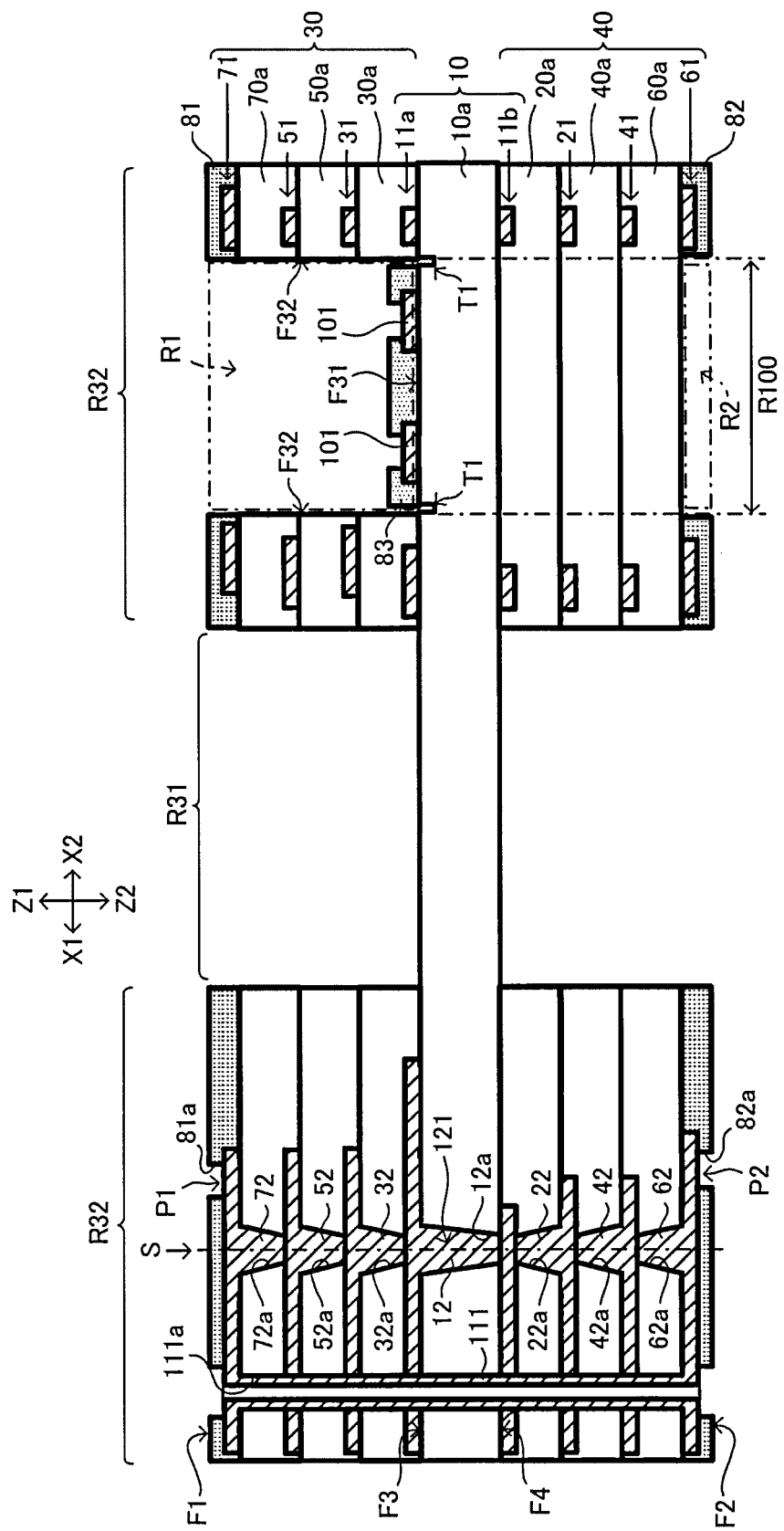
FIG. 43 is, in yet another embodiment of the present invention, a view showing a flex-rigid wiring board.

It may be a flex-rigid wiring board having flexible section (R31) and rigid sections (R32) as shown in FIG. 43, for example. In the example in FIG. 43, insulative substrate (10a) is a flexible substrate. Cavity (R1) is formed in rigid section (R32), and opening portion (R2) (an opening portion not for a pad) is formed on the back face of cavity (R1) in solder resist 82.

Figure 44:
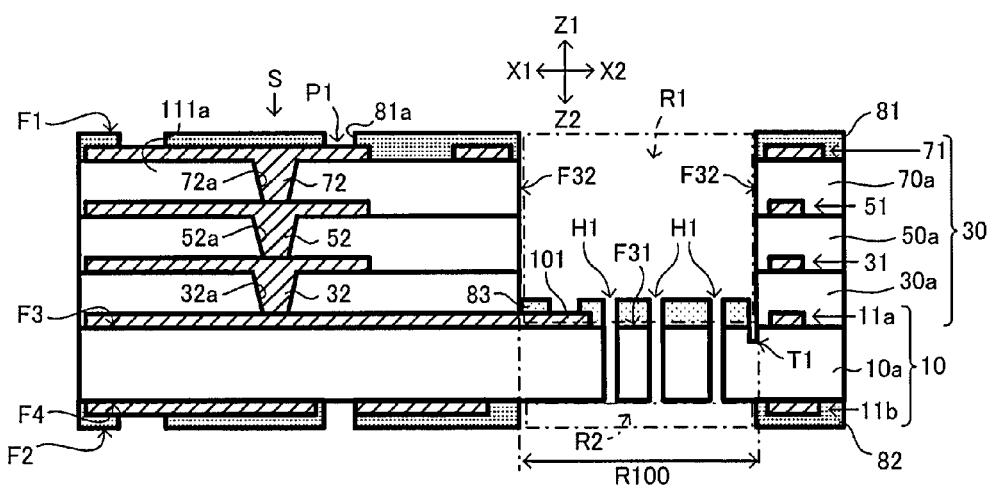
FIG. 44 is, in yet another embodiment of the present invention, a view showing a single-sided wiring board.

It may be a single-sided wiring board having a laminated section (buildup section) only on one side of the core substrate (insulative substrate 10a) as shown in FIG. 44, for example.

Via conductors (12, 22, 32, 42, 52, 62, 72) are not limited to filled conductors, and they may be conformal conductors, for example.

In addition, the materials for each conductive layer, via conductor and through-hole conductor are not limited to the above, and they may be modified depending on their usage requirements or the like. For example, metals other than copper may be used as conductive material, or non-metallic conductors may also be used. The material for each insulation layer may also be selected freely. However, as for resins to form interlayer insulation layers, thermosetting resins or thermoplastic resins are preferable. As for thermosetting resins, polyimide, BT resin, allyl polyphenylene ether resin (A-PPE resin), aramid resin or the like, for example, may be used other than epoxy resin. Also, as for thermoplastic resins, liquid-crystal polymer (LCP), PEEK resin, PTFE resin (fluororesin) or the like, for example, may be used. Such material is preferred to be selected according to requirements from the viewpoints of insulation, dielectric properties, heat resistance, mechanical characteristics and the like. Also, the above resins may contain additives such as curing agents, stabilizer, filler or the like. In addition, each conductive layer, each insulation layer and the like may be formed with multiple layers made of different materials.

The steps for manufacturing wiring boards are not limited to the order and contents shown in the flowchart in FIG. 10. The order and contents may be modified freely within a scope that does not deviate from the gist of the present invention. Also, some step may be omitted depending on usage requirements.

Step (S15) (FIG. 10 or FIG. 27) for forming outer solder resist may be conducted after step (S17) (FIG. 10 or FIG. 27) for forming cavity (R1). Also, step (S12) (FIG. 10 or FIG. 27) for forming inner solder resist and step (S15) for forming outer solder resist (FIG. 10 or FIG. 27) may be conducted simultaneously.

Wet or dry etching may be conducted instead of using a laser, for example. When etching is used, portions that are not required to be removed are preferred to be protected in advance by resist or the like.

Also, methods for forming each conductive layer are not limited specifically. For example, conductive layers may be formed by any one of the following methods or a combination of two or more methods: panel plating, pattern plating, full-additive, semi-additive (SAP), subtractive, transfer and tenting methods.

Each embodiment, modified example or the like described above may be combined freely. For example, any structure shown in FIGS. 30A-30C may be combined with either structure shown in FIGS. 33A and 33B. It is preferred to select an appropriate combination according to usage requirements or the like.

A wiring board according to one embodiment of the present invention has a first surface, a second surface opposite the first surface, a recessed portion that opens on the first-surface side, a first-surface side pad formed on the bottom surface of the recessed portion, a second-surface side pad formed on the second surface, and a second-surface side solder resist. In the second-surface side solder resist, a first opening portion for exposing the second-surface side pad and a second opening portion positioned on the back face of the recessed portion that excludes the second-surface side pad are formed.

A wiring board according to another embodiment of the present invention has a recessed portion that opens on one side, and a pad for mounting an electronic device on the bottom surface of the recessed portion. In such a wiring board, a non-plated through hole is formed to penetrate from the bottom surface of the recessed portion to the second surface.

A method for manufacturing a wiring board according to yet another embodiment of the present invention includes the following: by forming a recessed portion that opens on a first-surface side of a wiring board, exposing on the bottom surface of the recessed portion a first-surface side pad for mounting an electronic device; forming a second-surface side pad on a second surface opposite the first surface of the wiring board; and on the second surface of the wiring board, forming a second-surface side solder resist having a first opening portion for exposing the second-surface side pad and a second opening portion positioned on the back face of the recessed portion that excludes the second-surface side pad.

A method for manufacturing a wiring board according to still another embodiment of the present invention includes the following: by forming a recessed portion that opens on one side of a wiring board, exposing on the bottom surface of the recessed portion a pad for mounting an electronic device; and forming a non-plated through hole that penetrates from the bottom surface of the recessed portion to the second surface.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a laminated structure having a recessed portion on a first-surface side of the laminated structure and a solder resist layer on a second-surface side of the laminated structure on an opposite side of the first-surface side,
wherein the laminated structure has a first-surface side pad formed on a bottom surface of the recessed portion and a second-surface side pad formed on the second-surface side of the laminated structure, laminated structure has a first opening portion and a second opening portion formed on the second-surface side, the first opening portion is exposing the second-surface side pad, the second opening portion is formed on a back face of the recessed portion such that the back face of the recessed portion does not include a pad on the second-surface side of the laminated structure, and the second opening portion has a depth which is a same as or less than a thickness of the solder resist.

2. The wiring board according to claim 1, wherein the second opening portion has an opening area which is greater than an opening area of the first opening portion.

3. The wiring board according to claim 1, wherein the second opening portion is formed in a region corresponding to the recessed portion.

4. The wiring board according to claim 1, further comprising a first-surface side outer solder resist layer formed on the first-surface side of the laminated structure.

5. The wiring board according to claim 1, further comprising a first-surface side inner solder resist layer formed on the bottom surface of the recessed portion, wherein the first-surface side inner solder resist layer has an opening portion corresponding to the first-surface side pad.

6. The wiring board according to claim 1, wherein the laminated structure includes a core substrate, a first buildup portion formed on a surface of the core substrate, and a second buildup portion formed on an opposite surface of the core substrate, wherein the first buildup portion has an interlayer insulation layer and a conductive layer, the second buildup portion has an interlayer insulation layer and a conductive layer, the recessed portion is formed in the first buildup portion, and the solder resist layer is formed on the second buildup portion.

7. The wiring board according to claim 1, wherein the recessed portion has a wall surface which is a cut surface cutting through a plurality of interlayer insulation layers.

8. The wiring board according to claim 6, further comprising a first-surface side outer solder resist layer formed on the first buildup portion.

9. The wiring board according to claim 6, wherein the interlayer insulation layer of the second buildup portion is formed at a predetermined tier from the core substrate and has a thermal expansion coefficient which is set lower than a thermal expansion coefficient of the interlayer insulation layer of the first buildup portion formed at the predetermined tier from the core substrate.

10. The wiring board according to claim 6, further comprising another first-surface side pad formed on the first buildup portion.

11. The wiring board according to claim 10, further comprising:
an anticorrosion layer formed on a surface layer of the first-surface side pad; and
an anticorrosion layer formed on a surface layer of the other first-surface side pad,
wherein the anticorrosion layer formed on the surface layer of the first-surface side pad and the anticorrosion layer formed on the surface layer of the other first-surface side pad are made of a same material.

12. The wiring board according to claim 6, wherein the second buildup portion has an outermost conductive layer on the back face of the recessed portion, and the second opening portion of the solder resist layer is exposing the outermost conductive layer of the second buildup portion.

13. The wiring board according to claim 12, wherein the outermost conductive layer exposed in the second opening portion is a planar conductive pattern.

14. The wiring board according to claim 1, wherein the laminated structure has a non-plated through hole penetrating from the bottom surface of the recessed portion to the second-surface side of the laminated structure.

15. A wiring board, comprising:
a laminated structure having a recessed portion on a first surface of the laminated structure and a pad configured to mount an electronic device on a bottom surface of the recessed portion,
wherein the laminated structure has a non-plated through hole penetrating from the bottom surface of the recessed portion to a second surface of the laminated structure on an opposite side of the first surface of the laminated structure.

16. A method for manufacturing a wiring board, comprising:
preparing a laminated structure having a first-surface side pad configured to mount an electronic device on a first surface-side of the laminated structure and a solder resist layer on a second surface-side on an opposite side of the first surface-side;
forming a recessed portion on the first surface-side of the laminated structure such that the first-surface side pad is exposed on a bottom surface of the recessed portion;
forming a first opening portion on the second surface-side of the laminated structure such that a second-surface side pad is exposed on the second surface-side; and
forming a second opening portion on the second surface-side of the laminated structure such that a portion of the laminated structure corresponding to a back face of the recessed portion is exposed on the second surface-side,
wherein the forming of the second opening portion comprises forming the second opening portion on the second surface-side of the laminated structure such that the back face of the recessed portion does not include a pad on the second surface-side of the laminated structure, and the second opening portion has a depth which is a same as or less than a thickness of the solder resist.

17. A method for manufacturing a wiring board, comprising:
preparing a laminated structure having a first-surface side pad configured to mount an electronic device in the laminated structure;
forming a recessed portion on a first surface of the laminated structure such that the first-surface side pad is exposed on a bottom surface of the recessed portion; and
forming a non-plated through hole in the laminated structure such that the non-plated through hole penetrates from the bottom surface of the recessed portion to a second surface of the laminated structure on an opposite side of the first surface of the laminated structure.

18. The method for manufacturing a wiring board according to claim 17, further comprising:
forming a second-surface side pad on the second surface of the laminated structure;
forming a solder resist layer on the second surface of the laminated structure;
forming a first opening portion through the solder resist layer such that the second-surface side pad is exposed; and
forming a second opening portion through the solder resist layer such that a portion of the second surface of the laminated structure corresponding to a back face of the recessed portion is exposed,
wherein the back face of the recessed portion does not include the second-surface side pad.

19. The wiring board according to claim 6, wherein the second buildup portion does not have a recess portion penetrating through the interlayer insulation layer of the second buildup portion.

20. The wiring board according to claim 1, wherein the second opening portion has a depth which is a same as a thickness of the solder resist.

* * * * *